United States Patent [19]
Liao et al.

[11] Patent Number: 6,152,612
[45] Date of Patent: *Nov. 28, 2000

[54] SYSTEM AND METHOD FOR SYSTEM LEVEL AND CIRCUIT LEVEL MODELING AND DESIGN SIMULATION USING C++

[75] Inventors: Stan Liao, Sunnyvale; Steve Tjiang, Palo Alto; Rajesh Gupta, Irvine, all of Calif.

[73] Assignee: Synopsys, Inc., Mountain View, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/871,805

[22] Filed: Jun. 9, 1997

[51] Int. Cl.$^7$ ................................................. G06F 17/50
[52] U.S. Cl. ................... 395/500; 395/672; 395/682; 364/578; 364/489; 364/490; 707/103
[58] Field of Search .................... 395/500, 701, 395/381, 382, 385, 672, 680, 800.28, 682; 364/578, 489, 490; 707/103

[56] References Cited

U.S. PATENT DOCUMENTS

| | | | |
|---|---|---|---|
| 5,345,450 | 9/1994 | Saw et al. | 371/27 |
| 5,487,018 | 1/1996 | Loos et al. | 364/489 |
| 5,548,797 | 8/1996 | Aumilli et al. | 395/880 |
| 5,550,760 | 8/1996 | Razdon et al. | 364/578 |
| 5,572,712 | 11/1996 | Jamal | 395/500 |
| 5,625,580 | 4/1997 | Read et al. | 364/578 |
| 5,630,100 | 5/1997 | Ganapathy et al. | 395/500 |
| 5,634,115 | 5/1997 | Fitzpatrick et al. | 395/500 |
| 5,831,869 | 11/1998 | Ellis et al. | 364/490 |
| 5,838,583 | 11/1998 | Varadarajan et al. | 364/491 |
| 5,841,663 | 11/1998 | Sharma et al. | 364/490 |
| 5,859,785 | 1/1999 | Kundert | 364/578 |

FOREIGN PATENT DOCUMENTS

| | | | |
|---|---|---|---|
| 0 047 388 | 3/1982 | European Pat. Off. | G06F 15/20 |
| 0 100 341 | 2/1984 | European Pat. Off. | G06F 15/20 |
| 0 168 650 | 1/1986 | European Pat. Off. | G06F 15/60 |

(List continued on next page.)

OTHER PUBLICATIONS

Rajesh Kumar Gupta; "Co–Synthesis of Hardware and Software for Digital embedded Systems"; Department of Electrical Engineering; Stanford University, CA; Dec. 10, 1993.

Aubury et al.; "Handel–C Language Reference Guide"; Oxford University Computing Laboratory; Aug. 28, 1996.

*Primary Examiner*—Kevin J. Teska
*Assistant Examiner*—Thai Phan
*Attorney, Agent, or Firm*—Wagner, Murabito & Hao LLP

[57] ABSTRACT

A system and method for system and circuit level design modeling and simulation using the C++ programming language. Program interfaces in a behavior-less base class are provided to allow a circuit designer to model hardware blocks using user processes in C++. The present invention provides for the manipulation of software user processes that represent the behavior of circuit blocks. C++ is advantageous because it is a familiar language for many designers in the computer industry and therefore requires a smaller learning curve. The novel interface provides an efficient implementation of reactivity (waiting and watching) and concurrency (signals and processes) allowing designers to use C++ to model mixed hardware-software systems with a C++ compiler and a library of the present invention without the need of a complex event-driven run-time kernel, often required in other hardware description languages (HDLs). Hardware descriptions of the present invention are readily mapped in to synthesizable intermediate representations and synthesized into hardware implementations using commercially available tools. The novel program interfaces allow user processes, which communicate with signals, to be timed on defined clock edges of various clock objects. User processes respond to events (reactivity) using next( ), wait( ), wait_until( ) and watching( ) functions. The present invention provides an efficient mechanism for context switching with reduces processing overhead by using lambdas (delay-evaluated expression objects). The present invention also provides an efficient implementation of representing a circuit's multi-valued logic signals in C++ and also provides an efficient implementation of instantiation of circuit blocks and elements using C++.

32 Claims, 19 Drawing Sheets

FOREIGN PATENT DOCUMENTS

| | | | |
|---|---|---|---|
| 0 416 669 | 3/1991 | European Pat. Off. | G06F 17/50 |
| 0 442 277 | 8/1991 | European Pat. Off. | G06F 15/60 |
| 0 463 301 | 1/1992 | European Pat. Off. | G06F 15/60 |
| 0 525 576 | 2/1993 | European Pat. Off. | G06F 15/60 |
| 0 592 715 | 4/1994 | European Pat. Off. | G06F 11/267 |
| 0 598 476 | 5/1994 | European Pat. Off. | G06F 15/60 |
| 0 657 832 | 6/1995 | European Pat. Off. | G06F 17/50 |
| 0 683 463 | 11/1995 | European Pat. Off. | G06F 17/50 |
| 0 733 984 | 3/1996 | European Pat. Off. | G06F 17/50 |
| 0 767 544 | 4/1997 | European Pat. Off. | H04B 1/707 |
| 0 772 140 | 5/1997 | European Pat. Off. | G06F 17/50 |
| 0 777 180 | 6/1997 | European Pat. Off. | G06F 11/26 |
| 0 834 823 | 8/1997 | European Pat. Off. | G06F 17/50 |
| 0 829 812 | 3/1998 | European Pat. Off. | G05F 17/50 |
| 0 867 820 | 9/1998 | European Pat. Off. | G06F 17/50 |
| 2 681 748 | 3/1993 | France | H04L 12/28 |
| 38 09 771 | 10/1989 | Germany | G06F 15/60 |
| 44 08 106 | 12/1994 | Germany | G06F 15/60 |
| 2 229 300 | 9/1990 | United Kingdom | G06F 15/60 |
| 2 213 967 | 6/1992 | United Kingdom | G06F 15/60 |
| WO 90/11569 | 10/1990 | WIPO | G06F 15/18 |
| WO 94/10627 | 5/1994 | WIPO | G06F 5/00 |
| WO 94/15311 | 7/1994 | WIPO | G06F 15/60 |
| WO 95/27948 | 10/1995 | WIPO | G06F 17/50 |
| WO 96/02039 | 1/1996 | WIPO | G06F 17/50 |
| WO 96/19773 | 6/1996 | WIPO | G06F 17/50 |
| WO 98/15976 | 4/1998 | WIPO | H01F 27/02 |
| WO 98/37500 | 8/1998 | WIPO | G06F 17/50 |
| WO 96/02038 | 1/1999 | WIPO | G06F 17/50 |

```
const std_ulogic: :std_ulogic_enum
std_ulogic: :char_table [256] =
{
```

```
/* translation to char */
const char
std_ulogic: :to_char_table [Ns1] =
{
    'U', 'X', '0', '1', 'Z', 'W', 'L', 'H', '-'
};
```

```
const std_ulogic::std_ulogic_enum
std_ulogic::and_table[Ns1][Ns1] =
{
//      U   X   O   1   Z   W   L   H   D { U,  U,  O,  U,  U,  U,  O,  U,  U },  // U
      { U,  X,  O,  X,  X,  X,  O,  X,  X },  // X
      { O,  O,  O,  O,  O,  O,  O,  O,  O },  // O
      { U,  X,  O,  1,  X,  X,  O,  1,  X },  // 1
      { U,  X,  O,  X,  X,  X,  O,  X,  X },  // Z
      { U,  X,  O,  X,  X,  X,  O,  X,  X },  // W
      { O,  O,  O,  O,  O,  O,  O,  O,  O },  // L
      { U,  X,  O,  1,  X,  X,  O,  1,  X },  // H
      { U,  X,  O,  X,  X,  X,  O,  X,  X }   // D
};
```

```
const std_ulogic::std_ulogic_enum
std_ulogic::or_table[Ns1][Ns1] =
{
//      U   X   O   1   Z   W   L   H   D
//----------------------------------------------
      { U,  U,  U,  1,  U,  U,  U,  1,  U },  // U
      { U,  X,  X,  1,  X,  X,  X,  1,  X },  // X
      { U,  X,  O,  1,  X,  X,  O,  1,  X },  // O
      { 1,  1,  1,  1,  1,  1,  1,  1,  1 },  // 1
      { U,  X,  X,  1,  X,  X,  X,  1,  X },  // Z
      { U,  X,  X,  1,  X,  X,  X,  1,  X },  // W
      { U,  X,  O,  1,  X,  X,  O,  1,  X },  // L
      { 1,  1,  1,  1,  1,  1,  1,  1,  1 },  // H
      { U,  X,  X,  1,  X,  X,  1,  X }       // D
};
```

FIG. 12B

```
                    const std_ulogic: :std_ulogic_enum
                    std_ulogic: :xor_table[Ns1] [Ns1] =
                    {
750                    //    U   X   O   1   Z   W   L   H   D
  ↘                    //-----------------------------------------
                         { U,  U,  U,  U,  U,  U,  U,  U,  U },  // U
                         { U,  X,  X,  X,  X,  X,  X,  X,  X },  // X
                         { U,  X,  O,  1,  X,  X,  O,  1,  X },  // O
                         { U,  X,  1,  O,  X,  X,  1,  O,  X },  // 1
                         { U,  X,  X,  X,  X,  X,  X,  X,  X },  // Z
                         { U,  X,  X,  X,  X,  X,  X,  X,  X },  // W
                         { U,  X,  O,  1,  X,  X,  O,  1,  X },  // L
                         { U,  X,  1,  O,  X,  X,  1,  O,  X },  // H
                         { U,  X,  X,  X,  X,  X,  X,  X,  X }   // D
                    };
```

FIG. 12C

```
760                 const std_ulogic: :std_ulogic_enum
  ↘                 std_ulogic: :not_table[Ns1] =
                    {
                       //    U   X   O   1   Z   W   L   H   D
                       //-----------------------------------------
                            U,  X,  1,  O,  X,  X,  1,  O,  X
                    };
```

FIG. 12D

SYSTEM AND METHOD FOR SYSTEM LEVEL AND CIRCUIT LEVEL MODELING AND DESIGN SIMULATION USING C++

BACKGROUND OF THE INVENTION (1) Field of the Invention

The present invention relates to the field of electronic design automation (EDA) for integrated circuits. More specifically, the present invention relates to the field of computer controlled systems and software for system and hardware simulation and circuit synthesis.

(2) Prior Art

Advances in processing technology have allowed a high-level of integration within modern integrated circuits and the advances have brought new challenges in the design of digital integrated circuit systems. For instance, higher integration has spurred a trend to integrate entire complex systems consisting of heterogeneous mixtures of hardware and software components into "system-on-a-chip" designs. This trend challenges computer aided design (CAD) tool developers to provide CAD tools that can support the designs required for these hardware/software heterogeneous systems. Specifically, as digital circuits and systems become more complex, system designers are becoming increasingly concerned about the system modeling tools they use and the degree to which these tools have an impact on overall productivity and the quality of hardware designs they produce. In addition, designers today want to be able to quickly produce a working model of the intended hardware, simulate it with the rest of the system and, if needed, synthesize and/or formally verify the design for specific properties (e.g., to test whether or not the design meets timing, area, power constraints, etc.).

Several researchers have proposed various methodologies for the hardware/software co-design of digital systems. Commercial tools have addressed some of the issues in co-design such as hardware/software co-simulation. However, these systems and methodologies require specialized software with specialized libraries and thereby increase the number of tools a circuit designer is required to learn to design integrated circuits. Moreover, none of these systems and methodologies have provided the use of a high-level programming language for performing both system and circuit design and simulation.

To this end, one of the most pressing issues in hardware/software co-design is that of design entry, e.g., the lack of a single language in which to describe both hardware and software components. A single language would facilitate seamless hardware/software co-simulation and help in circuit synthesis. Moreover, a single language would facilitate the step-by-step refinement of a system design down to its components. As such, it would be advantageous to provide a single language framework in which the designer can describe both hardware/software components of the circuit design. The present invention provides for such advantageous functionality.

Growth in the use of programming languages for system-level models is increasing because of the familiarity and experience of system designers with general-purpose high-level programming languages. Today, a system designer writes only the system-level models of an integrated circuit (IC) device in a high-level programming language and then performs an inefficient and often error-prone translation of that IC design into another language for circuit synthesis. For instance, the designer can estimate system performance and verify functional correctness of the IC designs using commonly available software compilers of the high-level programming language. However, to implement the IC design using circuit synthesis, the designer then needs to manually translate those parts of the model that will become hardware into a synthesizable subset of a specialized hardware description language (HDL), such as Verilog or VHDL. The HDLs are geared specifically toward hardware modeling and most common semantic extensions govern the use of structural components, exact event timing and concurrency of operations. These elements are largely absent in most high-level software programming languages. The translation from a high-level software programming language into a specialized HDL is often tedious and error-prone. Therefore, it would be advantageous to provide a single language framework that delegates the complexities of handling hardware semantics to a library of class and methods, thereby facilitating the development of hardware descriptions from existing code of a high-level programming language. The present invention provides such advantages.

Another reason for needing a translation between a high-level software programming language into a specialized HDL to perform hardware modeling is that HDLs have largely not been applied for system modeling. The use of HDLs in system modeling, architectural evaluation and hardware/software co-design has been mixed at best. One reason for this disadvantageous result has been the overhead of event processing required within an HDL. Another reason is that HDLs often do not have the facilities to describe software in an efficient and natural way. Further, HDLs typically have poor facilities to describe data structures. Also, they do not integrate seamlessly to existing software libraries. HDLs are often interpreted and therefore slow and their event and signal semantics make it difficult to compile HDLs to code that is an efficient to those generated by optimizing software compilers. Therefore, it would be advantageous to provide a single language framework for system and hardware modeling that is not HDL based. The present invention provides such advantages.

Accordingly, the present invention provides a single programming framework or application program interface (API) that is based on a high-level programming language to perform both system and hardware modeling (including architectural evaluation and hardware/software co-design). The present invention provides the above using the C++ high-level programming language and a specialized set of library classes and methods that create a specialized application program interface for EDA applications. These and other advantages of the present invention not specifically described above will become clear within discussions of the present invention herein.

SUMMARY OF THE INVENTION

The present invention utilizes a high-level programming language (C++) and specialized libraries (including inherited classes and types) to create a programming framework in which both the system and hardware aspects of an IC design can be modeled, simulated and synthesized by a designer. The use of a high-level programming language for hardware specification presents an opportunity to significantly shorten the learning curve for system designers in building hardware systems, or parts thereof, and simulating complete systems for correct functionality.

A method and system of the present invention are described herein for modeling hardware blocks of a circuit design using the C++ programming language. Program interfaces in a behavior-less base class are provided in the novel system that allow a circuit designer to model hardware blocks using C++. The present invention provides for the manipulation of software processes that represent the behavior of circuit blocks of a circuit design. C++ is advantageous because it is a familiar language for many circuit designers in the computer industry and therefore requires a smaller learning curve for developers to become proficient in for circuit modeling. The novel interface provides an efficient implementation of reactivity (waiting and watching) and concurrency (signals and processes) to allow IC designers to use C++ to model mixed hardware-software systems with a C++ compiler and a library of the present invention without the need of a complex event-driven run-time kernel, often required in other hardware description languages (e.g., HDLs). Hardware descriptions of the present invention are readily mapped into synthesizable intermediate representations, and synthesized into hardware implementations using commercially available tools.

The novel program interfaces of the present invention allow user processes (which model circuit blocks), which communicate with signals, to be timed on defined clock edges of various defined clock objects. Multiple clocks per IC design are supported. The present invention models the inherent simultaneous actions of hardware using concurrency which synchronizes lists of processes to certain defined clocks. Special functions, next( ), wait( ), wait_until( ) and watching ( ) within the present invention model a user process' response (i.e., reactivity) to signals and events. The present invention provides an efficient mechanism to reduce context-switching overhead by using delay-evaluated expression objects (or lambdas ). The present invention also provides an efficient implementation of representing a circuit's multi-valued logic signals in C++ and also provides an efficient implementation of instantiation of circuit blocks and elements using C++.

Specifically, embodiments of the present invention include a method of modeling a circuit in C++ in a computer system having a processor coupled to a bus and a memory coupled to the bus, the method comprising the steps of: a) modeling concurrency and reactivity within a C++ base class of a C++ library; b) deriving from a C++ base class a plurality of user-originated C++ user processes that model the behavior of the circuit so that the C++ library is linked with these user processes; and c) simulating the circuit by executing the plurality of C++ user processes, the step c) comprising the steps of: c1) modeling a circuit exception using a watching( ) function of the reactivity wherein exception handling C++ code within a first C++ user process is entered upon a lambda associated with the watching( ) function being evaluated to be true; c2) modeling circuit function to be performed within a clock cycle by suspending execution of a second C++ user process until a next clock cycle, the step c2) performed using a next( ) function of the reactivity; and c3) modeling circuit functionality that is dependent on a particular event by suspending execution of a third C++ user process until the particular event is evaluated to be true, the step c3) performed using a wait_until( ) function of the reactivity; and d) scheduling the plurality of C++ user processes for execution according to the concurrency, wherein the step d) comprises the steps of: d1) representing clock signals of the circuit as clock objects in C++ within the user program, the clock objects instantiated from the library clock class; d2) synchronizing the plurality of C++ user processes to an edge of a respective clock object; and d3) with a C++ scheduler, sequentially scheduling the plurality of C++ user processes for execution upon the occurrence of the edge of the respective clock object, the edge occurring within a priority queue maintained in the memory.

BRIEF DESCRIPTION OF THE DRAWINGS

FIG. 11A illustrates a lookup table used by the present invention for translating between a value in character code (ASCII) and a value of the multi-value logic of the present invention.

FIG. 11B illustrates a lookup table used by the present invention for translating between a value of the multi-value logic of the present invention and a character code (ASCII) value.

FIG. 12A is a lookup table indicating the proper outcome of an AND function between two values of the multi-value logic of the present invention.

FIG. 12B is a lookup table indicating the proper outcome of an OR function between two values of the multi-value logic of the present invention.

FIG. 12C is a lookup table indicating the proper outcome of an Exclusive OR function (XOR) between two values of the multi-value logic of the present invention.

FIG. 12D is a lookup table indicating the proper outcome of a NOT function of a value of the multi-value logic of the present invention.

DETAILED DESCRIPTION OF THE INVENTION

In the following detailed description of the present invention, a system and method for system-level and hardware level modeling, simulation and synthesis using C++, numerous specific details are set forth in order to provide a thorough understanding of the present invention. However, it will be obvious to one skilled in the art that the present invention may be practiced without these specific details. In other instances, well known methods, procedures, components, and circuits have not been described in detail to avoid unnecessarily obscuring aspects of the present invention.

I. NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to he action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

II. COMPUTER SYSTEM 112

Figure 1:
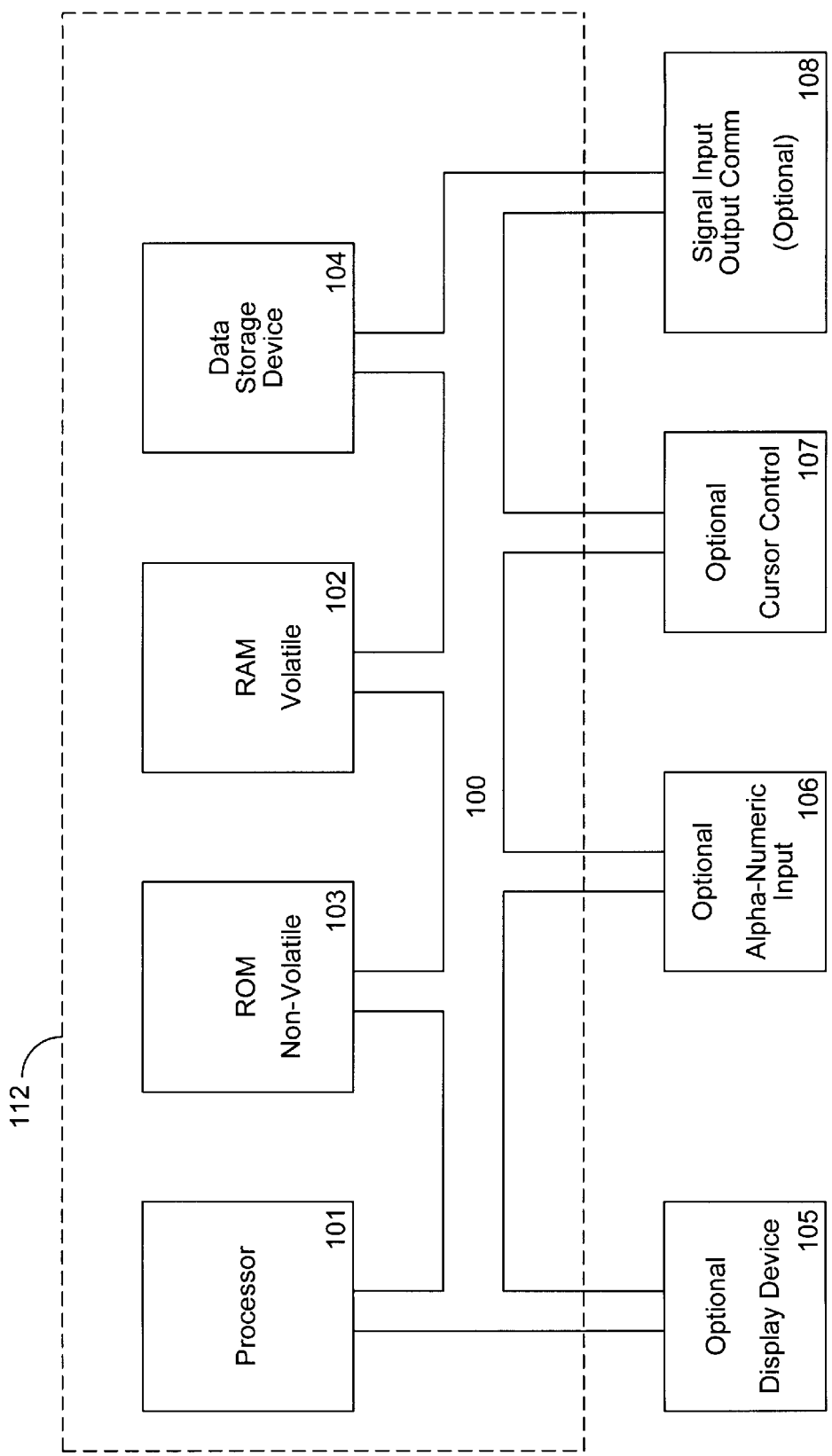
FIG. 1 illustrates a general-purpose computer controlled EDA system on which the present invention can be implemented.

Refer to FIG. 1 which illustrates a computer system 112. Within the following discussions of the present invention, certain processes (e.g., user processes 330 (a–y), scheduler process 410, process 600, and process 650) and steps are discussed that are realized, in one embodiment, as a series of instructions (e.g., software program) that reside within computer readable memory units of system 112 and executed by processors of system 112. When executed, the instructions cause the computer system 112 to perform specific actions and exhibit specific behaviors which are described in detail to follow.

In general, computer controlled EDA system 112 ("system 112") used by the present invention comprises an address/data bus 100 for communicating information, one or more central processors 101 coupled with the bus 100 for processing information and instructions, a computer readable volatile memory unit 102 (e.g., random access memory, static RAM, dynamic RAM, etc.) coupled with the bus 100 for storing information and instructions for the central processor(s) 101, a computer readable non-volatile memory unit (e.g., read only memory, programmable ROM, flash memory, EPROM, EEPROM, etc.) coupled with the bus 100 for storing static information and instructions for the processor(s) 101. System 112 also includes a mass storage computer readable data storage device 104 (hard drive or floppy) such as a magnetic or optical disk and disk drive coupled with the bus 100 for storing information and instructions. Optionally, system 112 can include a display device 105 coupled to the bus 100 for displaying information to the computer user, an alphanumeric input device 106 including alphanumeric and function keys coupled to the bus 100 for communicating information and command selections to the central processor(s) 101, a cursor control device 107 coupled to the bus 100 for communicating user input information and command selections to the central processor (s) 101, and an input/output signal generating device 108 coupled to the bus 100 for communicating command selections to the processor(s) 101.

III. GENERAL ENVIRONMENT

Figure 2:
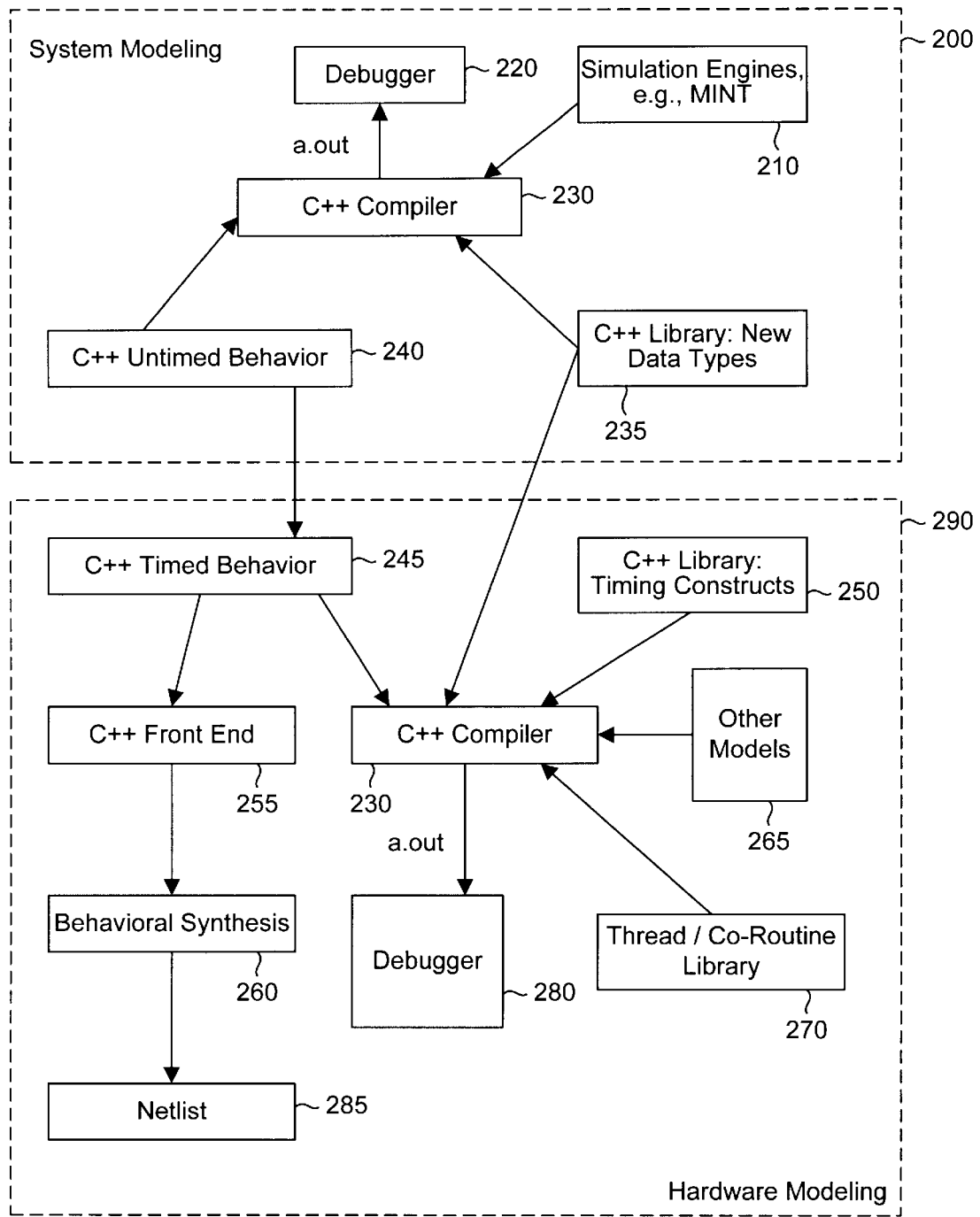
FIG. 2 is a flow chart illustrating a typical design flow in the framework of the present invention starting with an untimed description of an IC design in C++.

The present invention facilitates the EDA process by supplying a single language framework, based on C++, in which an integrated circuit designer (e.g., the "user" or the "designer") describes both hardware and software components of an integrated circuit design. An overview of the typical design process in the environment of the present invention is shown in FIG. 2. In FIG. 2, system modeling is shown in 200 and hardware modeling performed in 290. The design flow of FIG. 2 begins with an untimed behavior description 240 of the IC design in C++. The description 240 includes user processes (which model circuit blocks), clock objects and signals. Description 240 is compiled by a C++ compiler 230 along with a library of new data types and classes 235 of the present invention. The library 235, along with other information, provides a specialized framework or program "interface" that is effective for modeling hardware in C++. The C++ description 240 can be compiled and simulated for functional correctness. The design can be refined by adding timing information and again the timed description 245 can be compiled with a standard C++ compiler 230 using a C++ library of timing constructs 250 and the C++ library of new data types and classes 235. The IC design can be simulated with simulator 210 and debugged with debuggers 220 and 280. The same description 245 can be used for behavioral synthesis by a commercial synthesis engine 260 which provides a netlist 285. By using the framework of the present invention, the high-level language C++ is advantageously used for both system modeling 200 and also hardware modeling 290.

The present invention models synchronous circuit designs; which is a weak limitation since most hardware designs are synchronous. The present invention uses C++'s facilities to implement hardware-modeling features that can be easily mapped into synthesizable HDL. Circuit designers can continue to use widely available standard C++ compilers 230 and debuggers 220 to verify their designs, and to use commercially available synthesis tools 260 to implement their hardware.

Figure 3:
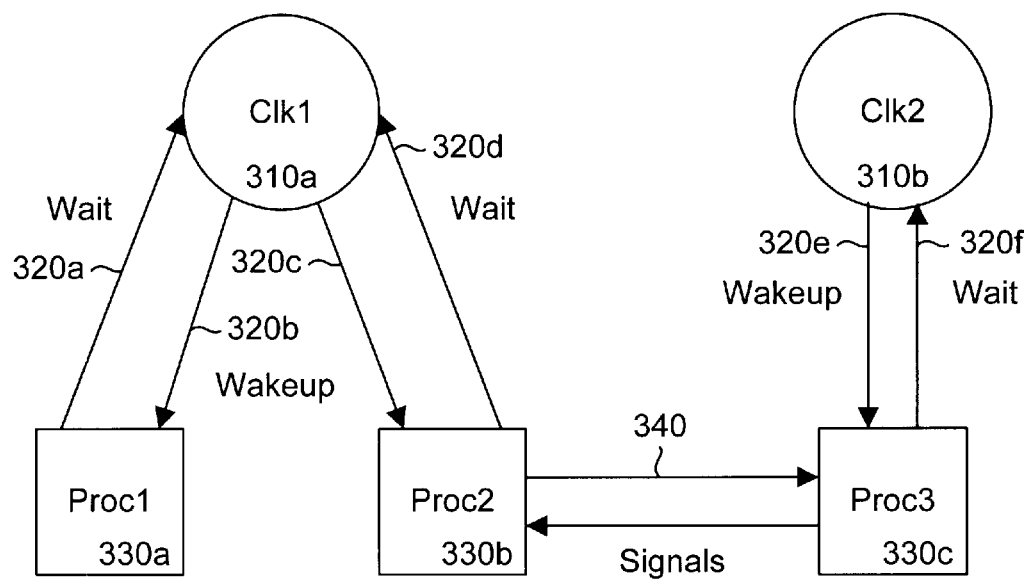
FIG. 3 is a logical diagram of an exemplary hardware system modeled by the present invention as a set of clocks, signals and interacting user processes.

FIG. 3 illustrates a high-level block diagram 300 of clocks and processes within the environment of the present invention. The user processes (e.g., processes 330a, 330b and 330c) represent logic blocks or circuit blocks of an exemplary integrated circuit design. By system 112 (FIG. 1) executing the user processes 330*a*–330*c*, the behavior of representative integrated circuit blocks is simulated and their hardware elements can be synthesized therefrom. Within the present invention, a hardware model consists of a set of user processes 330*a*–330*c* each of which is realized as a software process (or thread) with its own stack space with system 112. User processes 330*a*–330*c* represent circuit block behavior. Although a number of thread management processes can be used within the present invention, in one embodiment, the present invention utilizes a non-preemptive thread (co-routine) management package, see D. Keppel, "Tools and Techniques for Writing Fast Portable Threads Packages" published in Technical Report UW-CSE-93-05-06, University of Washington, 1993. As shown in FIG. 3, events generated by each user process are synchronized by an associated clock or clock object. User processes 330*a* and 330*b* are synchronized by clock 310*a* while user process 330*c* is synchronized by clock 310*b*. A scheduler 410 (FIG. 7) of the present invention maintains each clock and schedules the execution of the user processes 330*a*–330*c* as required.

Within the present invention, user processes can be synchronized to clock edges (rising and falling) or clock states. Generally, each event is identified as a delayed signal assignment, and the associated action is passed onto the clock processes 310*a*–310*b* of FIG. 3. A user process synchronizes with its clock by issuing it a wait message 320*a*, 320*d*, 320*f*. A wait message (also called "next" message) indicates that the process has completed all of the activity that it intends to complete, if any, for the given clock cycle. It is appreciated that a given process can contain multiple respective subprocesses or "segments" that can execute upon respective clock edges; that is, a user process is not required to fully execute all of its code from start to finish in each clock cycle. The clock processes 310*a*, 310*b* are scheduler-controlled and are responsible for performing the actions (e.g., signal updates) at the end of the clock cycle and for waking up the user processes thereafter (e.g., via wakeup messages 320*b*, 320*c*, 320*e*) when appropriate to do so.

Figure 13:
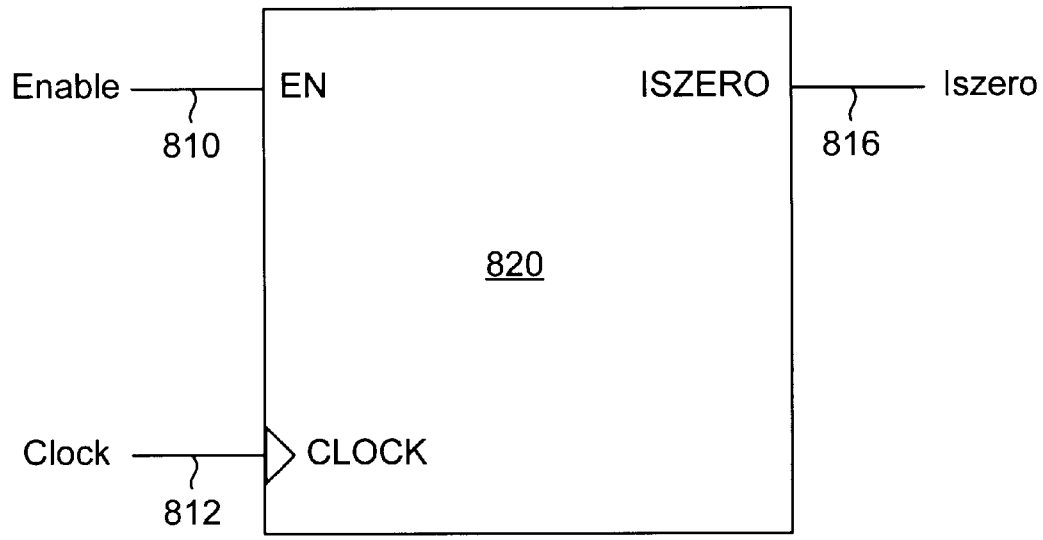
FIG. 13 is a block diagram of an exemplary cell modeled by the present invention framework.

Signals 340 of FIG. 3 to be passed between user processes 330*b*, 330*c* are available at the start of each clock cycle and are stored at the end of each clock cycle for subsequent use. In addition to describing circuit behaviors, the ability to describe structures is important to hardware modeling. A structural description consists of component instances and their interconnection as in netlist 285 (FIG. 2). Two elements in modeling structures within the present invention are ports and port maps. For example, FIG. 13 illustrates the enable port, EN, the CLOCK port, and the output port, ISZERO, of an exemplary circuit block 820. The present invention models ports using C++ references to signals; signals, in turn, are entities to which ports are mapped. Port mapping takes place at object instantiation time, and the constructor of each process object is responsible for binding signal arguments to the object's ports.

Figure 4:
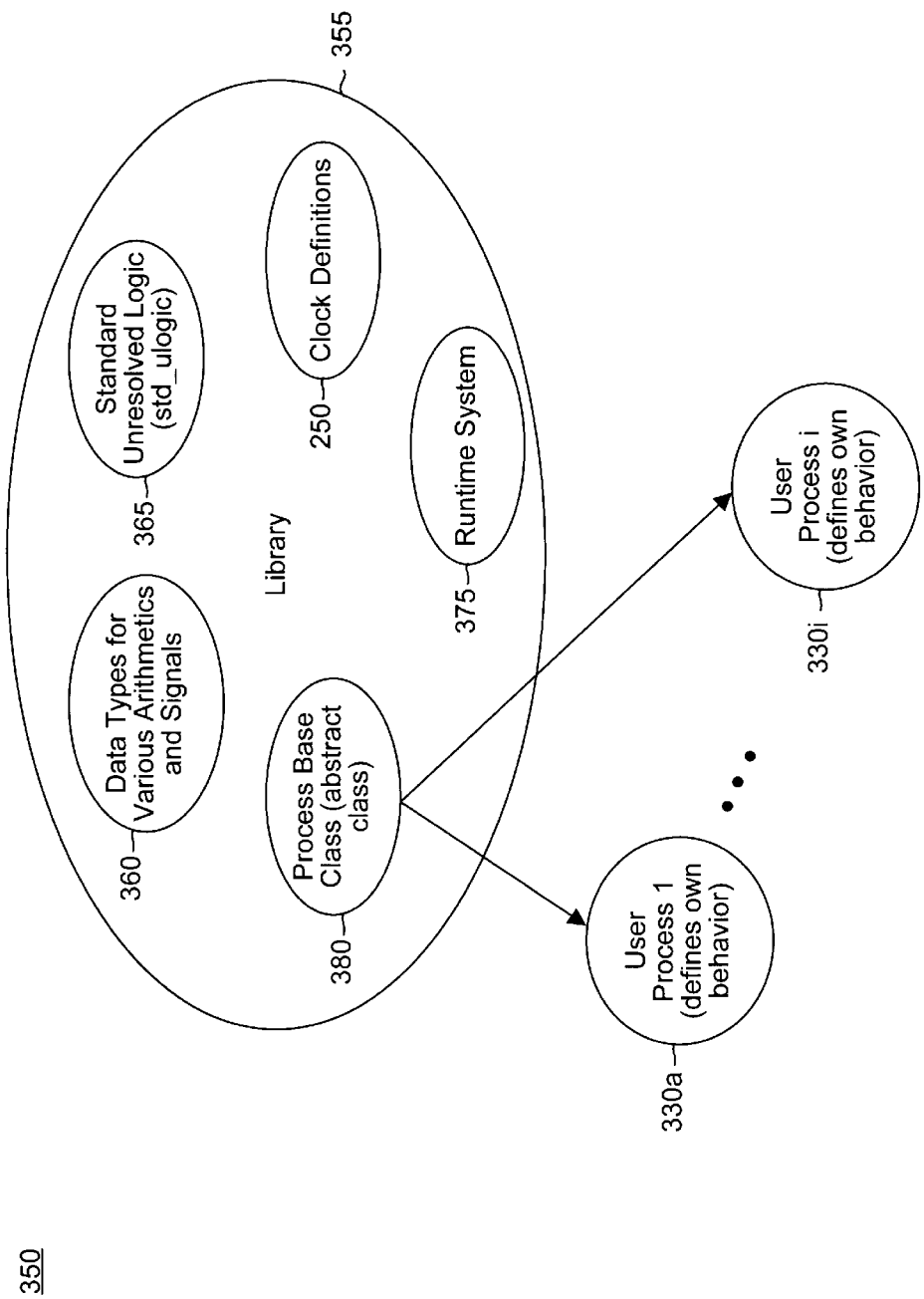
FIG. 4 is a logical diagram of library elements of the present invention and user processes that operate within the framework of the present invention.

FIG. 4 illustrates the elements of the present invention which are situated within a C++ library 355. The C++ library 355 is linked at compile time to multiple user processes thereby providing an interface (API) through which the multiple user processes 330*a*–330*i* can operate to model system and hardware levels of a respective integrated circuit design in C++. At compile time, the user processes 330*a*–330*i* each inherit predefined structure and definitions found within the C++ library 355 of the present invention which facilitate system and hardware modeling. Library 355 includes data types 360 and a process base class 380 of FIG. 4 which together form the new data types and class library element 235 (FIG. 2).

The C++ process base class 380 of library 355 of FIG. 4 is inherited by all user processes 330*a*–330*i* and provides each user process with certain functionality, such as clock synchronization, reactivity and concurrency that are parts of the software framework of the present invention. Notwithstanding the above, it is appreciated that to remain generic base class 380 itself has no behavior. A user process of 330*a*–330*i* within the present invention creates a process class that inherits from the base class 380. The C++ process base class 380, among other functions, includes program code to realize a scheduler 410 (FIG. 7) which schedules the execution of the user processes 330*a*–330*i*. Within the base class 380 are also structures which define reactivity and concurrency of the user processes 330*a*–330*i* and also how signals and events are maintained. Reactivity refers to how a user process interacts through events and signals (e.g., waiting and watching) while concurrency refers to the manner in which user processes are executed to simulate the intrinsically concurrent operation of hardware blocks in an IC design. The base class 380 of the present invention uses templates to maintain signals upon which events are based. It is appreciated that the process base class 380 is an abstract class in that it defines data structures but itself exhibits or defines no behavior because it needs to be generic. The required behavior comes from the user processes 330*a*–330*i* that inherit from and use the base class definitions and methods that are described further below.

The C++ clock definitions 250 (FIG. 4) library element of the present invention provides a framework around which clock signals are created, maintained and used by the scheduler 410 (FIG. 7), of the base class 380, to synchronize the execution of user processes 330*a*–330*i*. Multiple clocks can exist for a particular integrated circuit design. Another element of the present invention is the use of multiple-valued logic for representing signal states including unknown and don't-care values. The present invention provides this element by defining an aggregate type std_ulogic 365 of FIG. 4 and overloading the logic operators. The standard unresolved logic (std_ulogic) library element 365 defines a structure by which multi-value logic is supported for modeling hardware signals in C++. The present invention, vis-a-vis the std_ulogic 365, allows a signal value to be high (logical 1), low (logical 0), unknown, don't care, or tristate, among other logical values.

With reference to the library 355 of FIG. 4, any of a number of well known run time systems 375 can be used within the present invention. The above described particular library elements are each described in more detail to follow. It is appreciated that the user supplied user processes 330*a*–330*i* in conjunction with the library elements 355 of the present invention model the system and hardware elements of a particular IC design. The user processes 330*a*–330*i* supply the behavior of the particular hardware elements of the IC design while the base class 380, along with the other elements of library 355, provides a framework within C++ in which the user processes operate to model the hardware.

The following describes the general manner in which the present invention allows a user process' behavior to be represented. A process class is declared by publicly deriving, or subtyping, from the library base class 380, thereby inheriting the fundamental capabilities of a user process that are defined in the library 355. All sequential processes are synchronized on either the positive or the negative edge of some clock. A user process generally consists of the following member variables and functions: 1) input ports, each declared as a const-qualified reference to a signal; 2) output ports, each declared as a non-const-qualified reference to a signal; 3) state variables, if any; 4) generic constants, declared as const-qualified variables; and 5) a constructor.

The constructor takes the following arguments: a non-const-qualified reference to sc_clock_edge; for each input port declared in 1), a corresponding argument of the same type (const-qualified reference to a signal); for each output port declared in 2), a corresponding argument of the same type (non-const-qualified reference to a signal); for the generic constants declared in 4), additional arguments that are necessary to initialized them. When the constructor is called, these arguments need to be compile-time constants. Furthermore, the constructor is responsible for (using the constructor initializer syntax): passing the sc_clock_edge& argument to sc_process for base-class initialization; initializing the input and output ports to their corresponding arguments; initializing any state variables that do not have default constructors, e.g., supplying the leftmost and rightmost indices for an std_ulogic_vector; and initializing any generic constants.

The body of the constructor is normally empty, but can contain code that assigns initial values to state variables and to signals. It can also have assert( ) statements that check for consistency in process instantiation. The assertions can be desirable, for example, in parameterizable blocks to ensure that the length of a vector (which is associated with the object and not the type) is consistent with other generic constants. For a program to compile correctly with the C++ compiler 230 (FIG. 2), the constructor is placed in the public section. Other member variables are usually placed in the private section. A user process also consists of a member function declared as void entry( ). This function is to describe the behavior of the sequential process. An example of a user process defined with respect to the present invention is given below:

```
class FSM : public sc_process {
private:
    // input and output ports
    const signal_std_ulogic_vector& input;
         signal_std_ulogic_vector& output;
    // generic constants
    const    int delay:
    // state variables
    std_ulogic_vector counter;
    bool active;
public:
    // constructor
    FSM( sc_clock_edge& EDGE,
        const sc_signal<std_ulogic>& INPUT,
        sc_signal<std_ulogic>& OUTPUT,
        int D,
        bool INIT );
    // the entry( ) function required by sc_process
    void entry( ); };
FSM::FSM(  sc_clock_edge& EDGE,
        const sc_signal<std_ulogic>& INPUT,
        sc_signal<std_ulogic>& OUTPUT,
        int D,
        bool INIT )
    // The initializers sends EDGE to the base class sc_process,
    // and maps
    // ports to the arguments supplied at object instantiation.
    : sc_process(EDGE), input(INPUT), output(OUTPUT), delay(D)
{
    if (INIT) {
        active = true;
```

```
            counter = delay;
    }
    else {
        active = false;
        counter = 0;
    }
    write( output, '0' );
}
void
FSM::entry( )
{
    if (active) {
        if (counter == 0) {
            active = false;
            write( output, '1' );
        }
        else {
            --counter;
            write( output, '0' );
        }
        next( );
    }
    else {
        wait_until( input == '1' );
        active = true;
        counter = delay;
        next( );
    }
}
```

The functions next( ) and wait_until( ) are inherited from the base class 380 sc_process. The function next( ) suspends the user process until the next clock edge. The function wait_until( ) suspends the process until the condition specified in the argument becomes true. For a sequential process, the body of the function entry( ) is executed repeatedly, as if it were enclosed in an infinite loop. If the process is to execute once only (e.g., a test beach process that provides a reset signal), the halt( ) method may be invoked at the end of entry( ).

Another example of a user process is shown below with respect to a counter 820 of FIG. 13 and the C++ code shown below:

```
class Counter : public sc_process {
    const sc_signal<std_ulogic>& enable;
    sc_signal<std_ulogic>& iszero;
    int count;
public:
    Counter ( sc_clock_edge& EDGE,
        const sc_signal<std_ulogic>& ENABLE,
        sc_signal<std_ulogic>& ISZERO
        : sc_process (EDGE), enable(ENABLE),
        iszero(ISZERO)
    {
        count = 15;   // initialization
    }
    void entry();
}
```

Where the constructor for Counter takes as arguments a clock and the signals that comprise its interface. In this example and elsewhere, the base class 380 (FIG. 4) is called sc_process. The initializers in the constructor pass on the clock for base-class initialization (sc_process(EDGE)), and binds the port names to internal signal names. The behavior of the user-defined process is separately specified in the memory function entry( ), as shown immediately below:

```
void Counter::entry()
{
    if (enable.read() == '1') {
        if (count == 0) {
            write ( iszero, '1');
            count = 15;
        }
        else {
            write ( iszero, '0');
            count--;
        }
    }
    next ();
}
```

The above example demonstrates the use of the input/output features of the library 355 of the present invention: write( ) and read( ). Read and write operations on signals are specified by using the "read" and "write" functions on signals. The present invention enables this by defining all signal instances with respect to a primitive signal class. Calling the function write( ) places an event on the clock's list of actions. For instance, write(iszero, '1') schedules an update for the signal iszero, for the next clock edge. Write causes the specified signal to be updated at the end of the current clock cycle. The write function can be extended to accept an optional delay argument that specifies that the assignment is to happen after a certain number of clock cycles. The read( ) function reads the value assigned in the previous clock cycle. Also shown in the above example is the function next( ). The function next( ) synchronizes the user process with the next clock edge of its associated clock object. As discussed above, the body of the function entry( ) is repeatedly executed, even though there is no explicit enclosing loop.

IV. CONCURRENCY WITHIN THE PRESENT INVENTION

The present invention organizes a circuit design into a list of clock objects and user processes that are synchronized to these clocks. The user processes represent components of the design and adopt a particular execution order within the present invention. This execution order is synchronized according to the set of user created clock objects of predefined clock classes 250 (FIG. 4), and simulates the concurrency of operations inherent in hardware designs. The present invention adopts the general rule that circuit blocks that operate simultaneously in hardware are to be synchronized to a common clock object and during simulation become executed in series on each clock edge. Their data are settled by the start of a new clock edge and then the output signals are recorded at the completion of the clock cycle.

Figure 5:
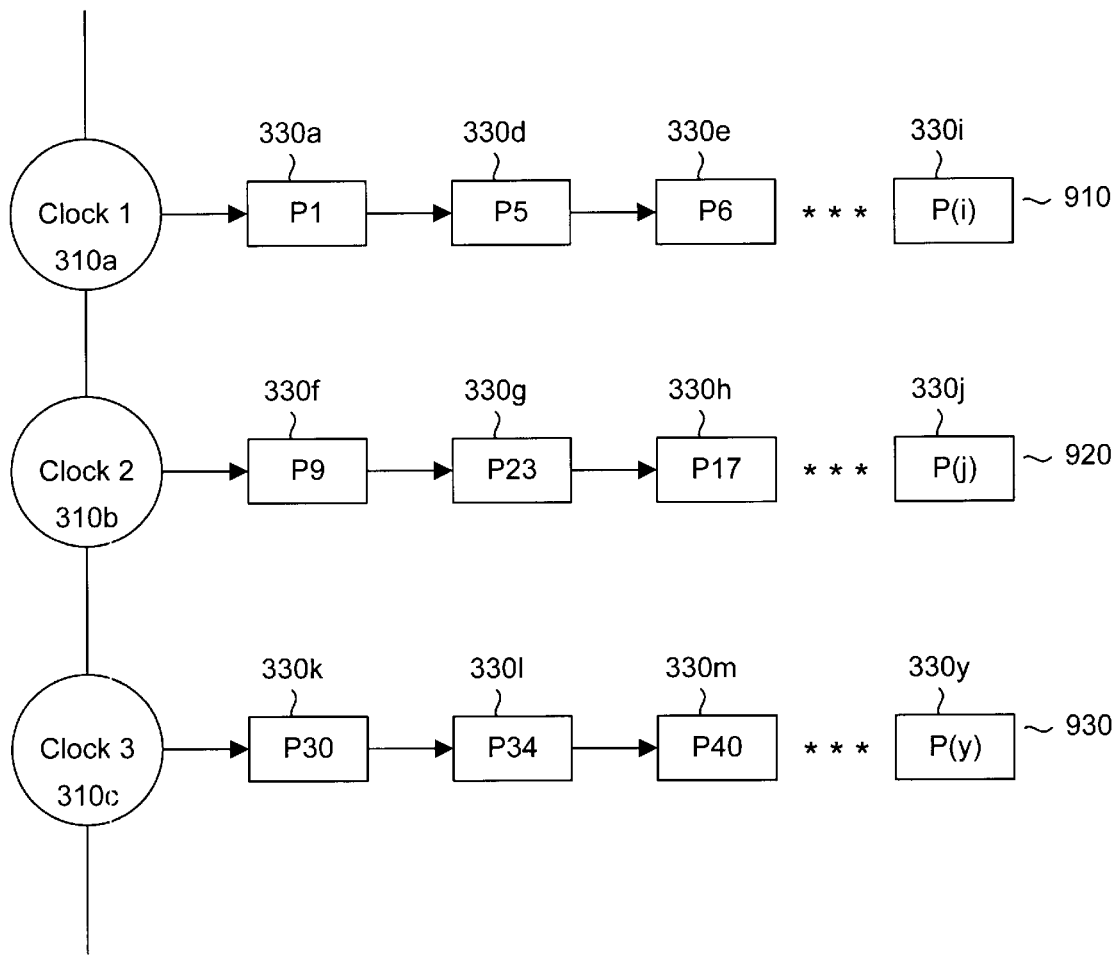
FIG. 5 is an exemplary diagram of concurrency within the present invention including multiple clock objects and an associated process list synchronized to each clock object.
Figure 6:
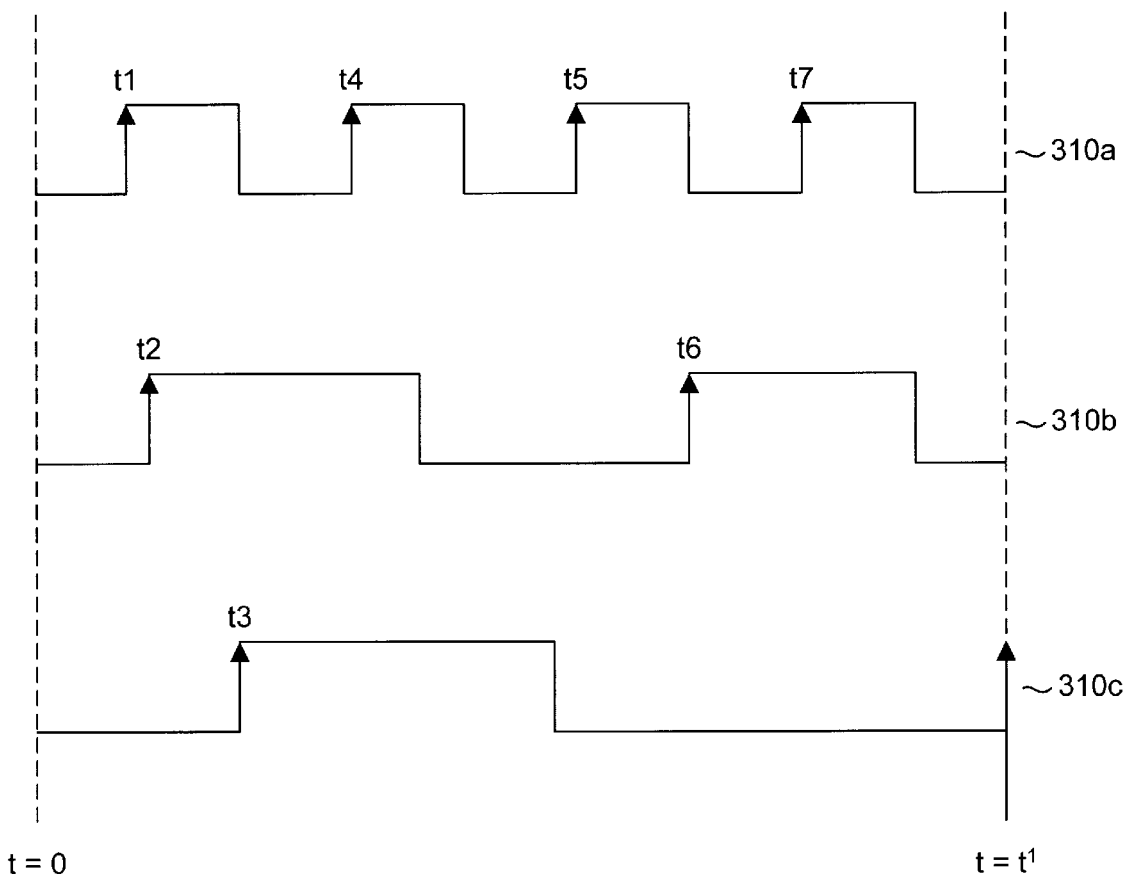
FIG. 6 illustrates timing diagrams for three exemplary clock objects that can be used within the framework of the present invention.

Process Lists and Clocks. FIG. 5 illustrates three exemplary clock objects, each clock having a process list associated therewith. As described above, each user process represents a hardware block and is timed according to a respective clock. As shown in FIG. 5, a first process list 910 includes processes 330a, 330d, 330e, . . . 330i and these processes are synchronized to clock 310a; a second process list 920 includes processes 330f, 330g, 330h, . . . 330j and these processes are synchronized to clock 310b; and a third process list 930 includes processes 330k, 330l, 330m, . . . 330y and these processes are clocked to clock 310c. Exemplary wave forms for these three clocks 310a–310c are shown in FIG. 6. Although the processes of a process list are synchronized to their associated clock, the order of execution of respective user processes within a process list is arbitrary; however, the order of execution has no observable effects.

Figure 7:
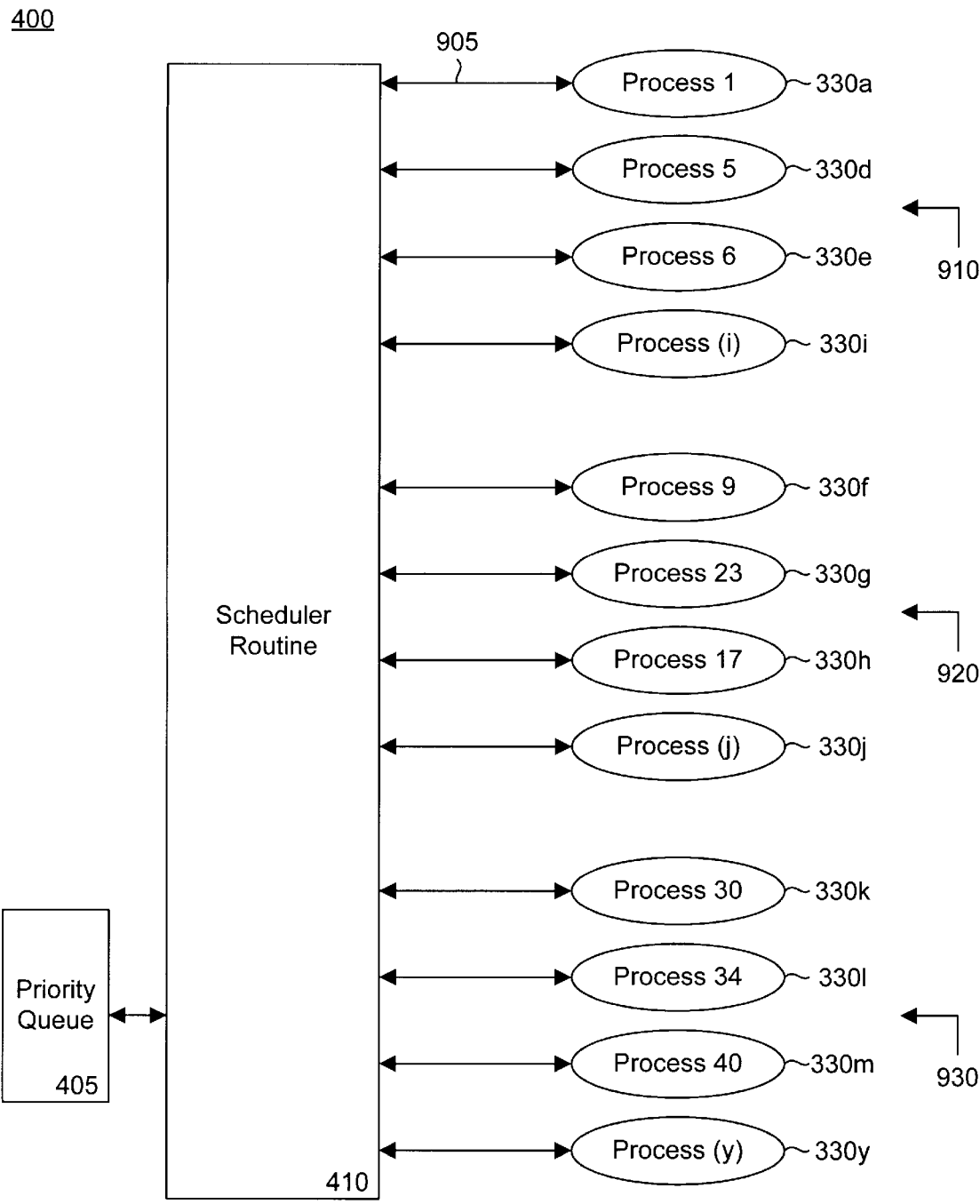
FIG. 7 is a control flow diagram of the scheduler process controlling the execution of multiple user processes within the present invention and interfacing with the priority queue.

The present invention simulates concurrency by scheduling for execution all of the user processes of the first process list 910 upon the appropriate clock edge of clock 310a appearing at the top of a clock edge queue called the priority queue 405 (FIG. 7). It is appreciated that concurrency within the present invention refers to the act of scheduling a user process for execution but not necessarily actually executing the user process because the scheduler 410 can decide not to execute a scheduled user process if the user process is not ready to be woken-up. As described herein, depending on the reason for which a user process is suspended, the scheduler 410 may determine not to execute the user process. For instance, the user process may be suspended incident to a wait( ) function and, upon scheduling, the number of clock cycles for which the user process is waiting may not have occurred yet. In this case, the scheduler 410 schedules the user process for execution but after testing certain conditions does not context switch into the user process to execute it. Furthermore, a user process may be suspended incident to a wait_until( ) function and the expression it is waiting for may not yet be true. Again, in this case, scheduler 410 schedules the user process for execution but after testing certain conditions does not context switch into the user process to execute it.

In the example of FIG. 5, the processes of the first process list 910 are scheduled for executed in sequence (e.g., from left to right) when the proper clock edge of clock 310a is seen at the top of the priority queue 405. The order of process execution within the first process list 910, however, is arbitrary. Likewise, the user processes of the second 920 and third 930 process lists are scheduled when the edges of clock 310b and clock 310c, respectively, are seen at the top of the priority queue 405. Again, the order of respective process execution within these process lists 920 and 930 is arbitrary. By performing the above scheduling, the present invention simulates the simultaneous execution of all circuit blocks within a given integrated circuit design.

Upon the completion of the execution of a particular process list, the present invention then computes the time instant for the next edge of the associated clock and places that information with a time stamp in the priority queue 405 (stored as a data structure within memory unit 102 of FIG. 1) which maintains a time referenced list of clock edges. At any given time, the priority queue 405 maintains information as to the next clock edge that need to be scheduled.

It is appreciated that the particular order of clock edges as shown in FIG. 5 from top to bottom, where clock 310a is first, clock 310b is second and clock 310c is last, is only but one order of execution. The ordering of clock edges within priority queue 405 is entirely dependent on the frequency of each clock. Since each clock can have a different period, duty cycle, and phase, the clocks are not necessarily based on any common reference. The present invention allows for the modeling of multiple clocks that are nonisochronous with respect to one another. In other words, while each user process is synchronous with respect to the clock that drives it, the periods and phases of clocks need not bear any relationship with one another. For instance, the waveforms of the exemplary clocks 310a, 310b and 310c are shown in FIG. 6. With reference to the clock waveforms of FIG. 6, the contents of the priority queue 405 if measured from time, t=0, to time, t=t', would resemble the sequence of clock rising edges as shown in Table I, below:

TABLE I

| Priority Queue 405 for Rising Clock Edges | | |
|---|---|---|
| Clock 310a | Rising Edge | Timestamp t1 |
| Clock 310b | Rising Edge | Timestamp t2 |
| Clock 310c | Rising Edge | Timestamp t3 |
| Clock 310a | Rising Edge | Timestamp t4 |
| Clock 310a | Rising Edge | Timestamp t5 |
| Clock 310b | Rising Edge | Timestamp t6 |
| Clock 310a | Rising Edge | Timestamp t7 |
| Clock 310c | Rising Edge | Timestamp t' |

FIG. 7 illustrates that the scheduler routine 410 of the present invention is responsible for updating the priority queue 405, which maintains the order of clock edges, and for scheduling the three groups 910, 920 and 930 of user processes. The double arrows of each control line (e.g., control line 905) indicate that after the execution of a particular process is completed, control is returned by the respective user process, e.g., user process 330a, to the scheduler 410. It is appreciated that each time system 112 (FIG. 1) traverses from the scheduler 410 to one of the user processes 330a–330i, a context-switch overhead of processing time is required. Therefore, within the present invention, the scheduler 410 of the present invention not only tracks clock signals but also performs checks on signal changes and conditions that are required to enter a user process in an effort to reduce context-switching overhead when a traversal from the scheduler 410 to a user process is not required.

Clock objects within the present invention are objects of type sc_clock. To implement clock-level asynchrony, the present invention first attaches two attributes to clocks: the period of the clock; and the time instant at which the clock begins running. For instance, the following declares two clocks which respectively have periods $\sqrt{2}$ and $\sqrt{3}$ time units, and begin running at time instants 0.0 and 0.5:

sc_clock clk1 (0.0, sqrt (2.0));

sc_clock clk2 (0.5, sqrt (3.0));

Each clock object (within the scheduler 410) is also responsible for keeping record of the time instant when its next edge will take place. When the function sc_clock::press_start_button( ) is called, the clocks are placed on the priority queue 405, ordered by the time of their next edge. In this case, the present invention uses an "event queue" where the only "events" in the system are clock edges, and process-level events, which are synchronized on these edges, are not explicitly manipulated at this level. As shown above with respect to Table I, each entry within the priority queue 405 indicates the clock identifier, its edge (rising or falling) and its time. As discussed above, the priority queue 405 is time ordered therefore new clock edges added to the priority queue 405 are inserted therein so that the entries are always time ordered.

Simulation. All objects (signals, clocks, and user processes) are maintained by the present invention throughout a simulation. When instantiating processes, the signals and clocks to which they are connected need to have already been instantiated. After this, the function sc_clock::press_start_button( ) is called with one argument that specifies the number of time units for which the simulation is to last, and two optional arguments: a callback function and a user-defined argument. The function, sc_clock::press_start_button( ), is discussed in more detail in Section VII below. The callback function, if supplied, is invoked every time a rising edge or a falling edge of any clock occurs. It adopts the following signature: int callback(const sc_clock_edge& edge, void* arg), where edge is the clock edge that has just taken place, and arg is the user-defined argument that is supplied to the function sc_clock::press_start_button( ). An implementation of press_start_button( ) is shown in the exemplary code sections sc_clock.h and sc_clock.cc listed in Section VII.

Generally, during simulation, the scheduler 410 takes the clock edge on the top of the priority queue 405 and schedules for execution all processes in that clock edge's process list. After, signals are recorded and the time of the next clock edge for that clock is recorded in the proper order in the priority queue 405. Only clock edges that trigger user processes are placed in the priority queue 405. The next clock edge in the priority queue 405 is then obtained, etc., and the simulation repeats for the predetermined time period. The simulation is explained in more detail in a flow chart of scheduler 410 starting with FIG. 9A below.

V. REACTIVITY WITHIN THE PRESENT INVENTION

In the present invention, the C++ class library 380 of FIG. 4 is provided to support reactivity. Reactivity support requires the following three elements: (1) concurrency or parallelism; (2) signals and events; and (3) the functions waiting and watching. With respect to concurrency, hardware is inherently parallel. Concurrency in operations can be modeled using support for program threads and co-routines in the form of libraries and clock classes, as described above. Concurrency is encapsulated in an object or class definition. Non-terminating hardware processes 330a–330i are then built by using the subtyping and virtual-function facilities of C++.

With respect to signals and events, hardware or user processes 330a–330i require signals and events to communicate. Templates within library element 360 and base class 380 are used to provide the concept of signals on which events will be detected. Although many thread/concurrency libraries for C++ provide other communication primitives such as semaphores and critical regions, such primitives are better suited for software because they usually assume that processes have easy access to each other's states; in other words, it is possible to refer to a process' internal variables. This assumption is, however, ill-suited for hardware modeling and synthesis.

Reactivity via the functions wait_until( ) and watching( ) is inherited by each user process from the base class 380. With respect to the waiting and watching functions of the present invention, hardware processes 330a–330i interact through events and signals. Thus, they need the ability to wait or watch for a particular condition or event. Waiting within the present invention refers to a blocking action, as in "wait_until (expression)", that can be associated with an event. On the other hand, watching within the present invention refers to a non-blocking action that runs in parallel with a specified behavior, as in "do p watching s". This construct is used within the present invention typically to handle preemptions; the semantics are such that regardless of the state of execution of a process, p, whenever signal s occurs, the process p is terminated. Delay-evaluated expressions, or lambdas, are used in wait_until expressions and these lambdas are evaluated by the scheduler 410 to determine whether or not to enter a process when the appropriate clock edge occurs.

WAIT( ) FOR THE NEXT CLOCK EDGE. When a user process of 330a–330i reaches a next( ) or wait( ) statement, it immediately exits to the scheduler 410. Upon execution returning to the user process, the user process' code continues where it left off at the next( ) or wait( ). Within the present invention, the following expression can be used within a user process:

next ( ) ;

to implement the next function. The next( ) function, or its synonym wait( ), can be invoked in a derived class of sc_process as it is inherited therefrom. It can take an optional argument that indicates the number of clock edges to wait for. This function causes a user process to suspend until the next clock edge. Thus, calling next( ) with an argument k will have the same semantics as invoking it k times without an argument. The form with the argument, however, is more efficient (when compiled with a C++ compiler). By providing multiple next( ) or wait( ) in a user process, the user process can execute different routines over consecutive clock cycles before looping back to start the user process over.

WAIT_UNTIL( ) AN EVENT. In communicating processes it is not uncommon for a process to suspend itself until some event occurs. When a user process executes the wait_until( ) function, control is returned to the scheduler 410 and the scheduler 410 suspends execution of the user process until the particular event occurs. Within the present invention, the event can be encapsulated in a delay-evaluated conditional expression (lambda) that is evaluated by the scheduler 410. In a synchronous methodology, the sampling of the event has to be synchronized on the clock. For instance, in VHDL it is written:

```
loop
    wait until clk'event and clk = '1';
    exit when start = '1';
end loop
``` to suspend the current process until the signal start becomes '1'. In the present invention, the expression is:

wait_until( start=='1');

causing the present invention to suspend execution of a user process until the indicated event has occurred. If the event does not occur for a given clock cycle, the scheduler 410 does not even context switch into the user process thereby saving context-switching time.

WATCHING( ) AN EVENT. An event is said to be watched if control flow is diverted from its normal path whenever that event occurs, regardless of the state of execution of the process. Within the present invention, watching an event (unlike waiting and next) does not suspend a user process; instead, the normal flow of the user process is preempted when the event occurs. When a user process executes a watching( ) function, it places the event to be watched into a watch list. When this event happens, exception handling code of the user process is executed. The most common example is watching of the reset signal.

EXAMPLE

```
class Counter : public sc_process {
    const sc_signal<std_ulogic>& reset;
    // ...
};
Counter::Counter()
{
    watching( reset == '1');
}
```

```
void
Counter::entry()
{
    try {
        if (reset.read 90 == '1') {
            // do reset sequence ...
        }
        // body of process goes here (nonexception)
    }
    catch (sc_user) {
        // exception caught here
    }
}
```

Where the normal (i.e., nonexception) part of the process is the "body of the process" and the exception handling portion begins with "catch". It is appreciated that the exception handling part is intentionally left empty, so that when an exception is caught, control is transferred to the beginning of the "try" block. This is necessary since during the execution of the reset sequence the reset signal may again be raised, and it may only be caught when the control is within the "try" block.

Figure 8A:
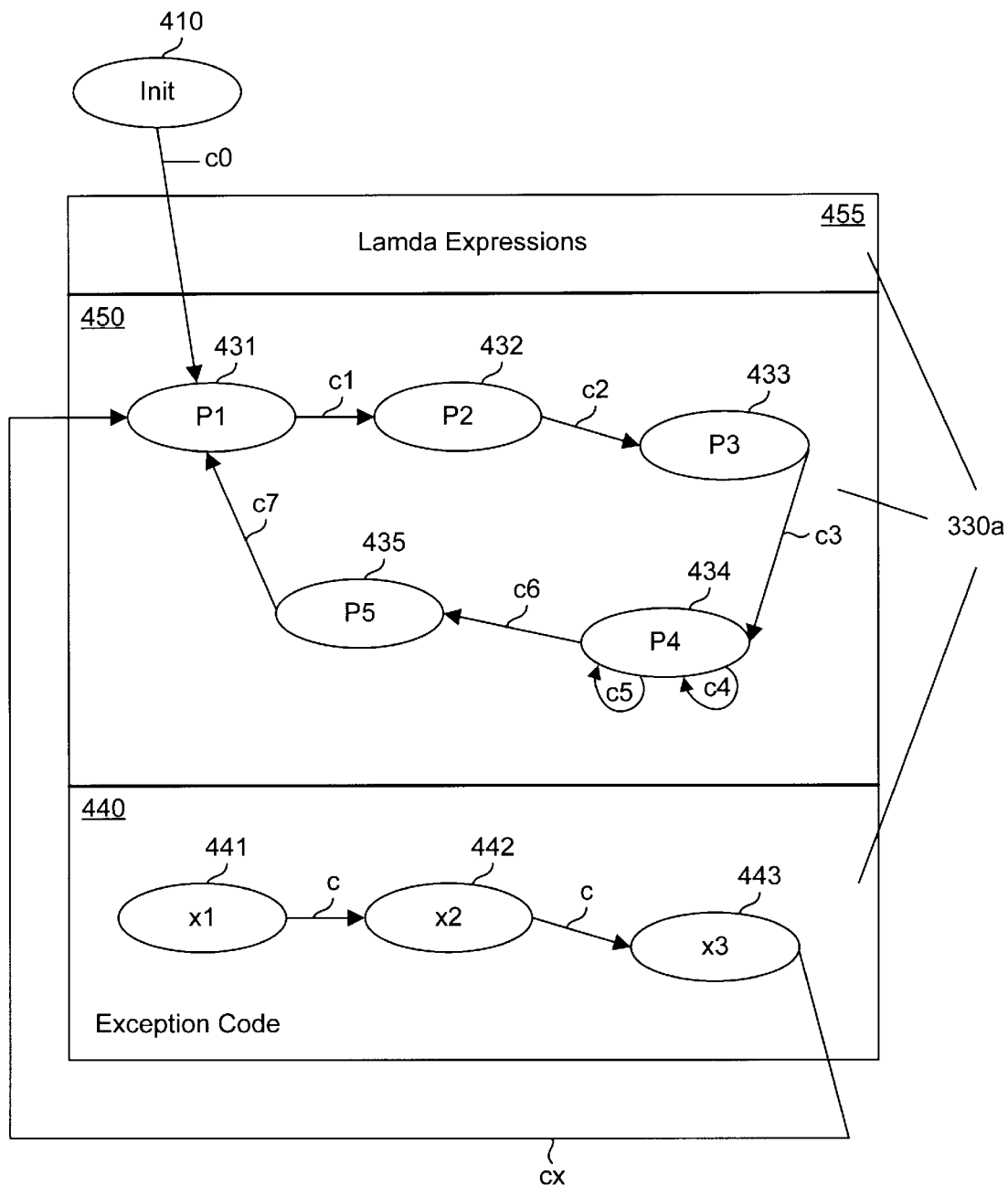
FIG. 8A is a logical element diagram of a user process of the present invention including: multiple nonexception subprocesses; lambda expressions from wait_until functions; and exception subprocesses that are invoked by watching functions.

Logical Diagrams. FIG. 8A illustrates a simplified logical diagram 430 of an exemplary user process 330a as defined with respect to the present invention to illustrate how the above reactivity functions cause a user process to react to its environment. This diagram 430 facilitates the explanation of certain elements of reactivity of the present invention. The user process 330a contains multiple subprocesses or segments 431–435 within the non-exception portion 450 of its code. Segments are separated by a next( ) or a wait( ) command within the user process' code. A segment can also be separated by a wait_until( ) command. These commands indicate to the scheduler 410 that the process' execution is complete for a given clock cycle. An example in pseudo code is shown below:

```
user_process330a:
{
    {
        /* code segment 431 */
    }
    next();
    {
        /* code segment 432 */
    }
    next();
    {
        /* code segment 433 */
    }
    next();
    {
        /* code segment 434 */
    }
    next(3);
    {
        /* code segment 435 */
    }
    next();
}
```

By having multiple next and wait statements in a process' code, different parts of the user process are executed over consecutive clock cycles as shown in FIG. 8A.

For instance, user process 330a commences execution by the scheduler 410 by executing segment 431 at the occurrence of an edge of clock 310a as indicated by c0 (clock 0) and when a next or wait is reached segment 431 completes.

At the next edge of clock 310a, as shown by c1, segment 432 commences and executes until another next or wait is reached. At the next edge of clock 310a, as shown by c2, segment 433 commences and executes until another next or wait is reached and at the next edge of clock 310a, as shown by c3, segment 434 commences and executes until another next or wait is reached. By placing an argument (3) in the next or wait field, the next two clock edges, c4 and c5 do not execute any segments within user process 330a. Upon the next edge of clock 310a (the third clock), as shown by c6, the last segment 435 is entered. Upon a the next edge of clock 310a, as shown by c7, the first segment 431 is entered again and process 330a continues in the fashion.

Figure 8B:
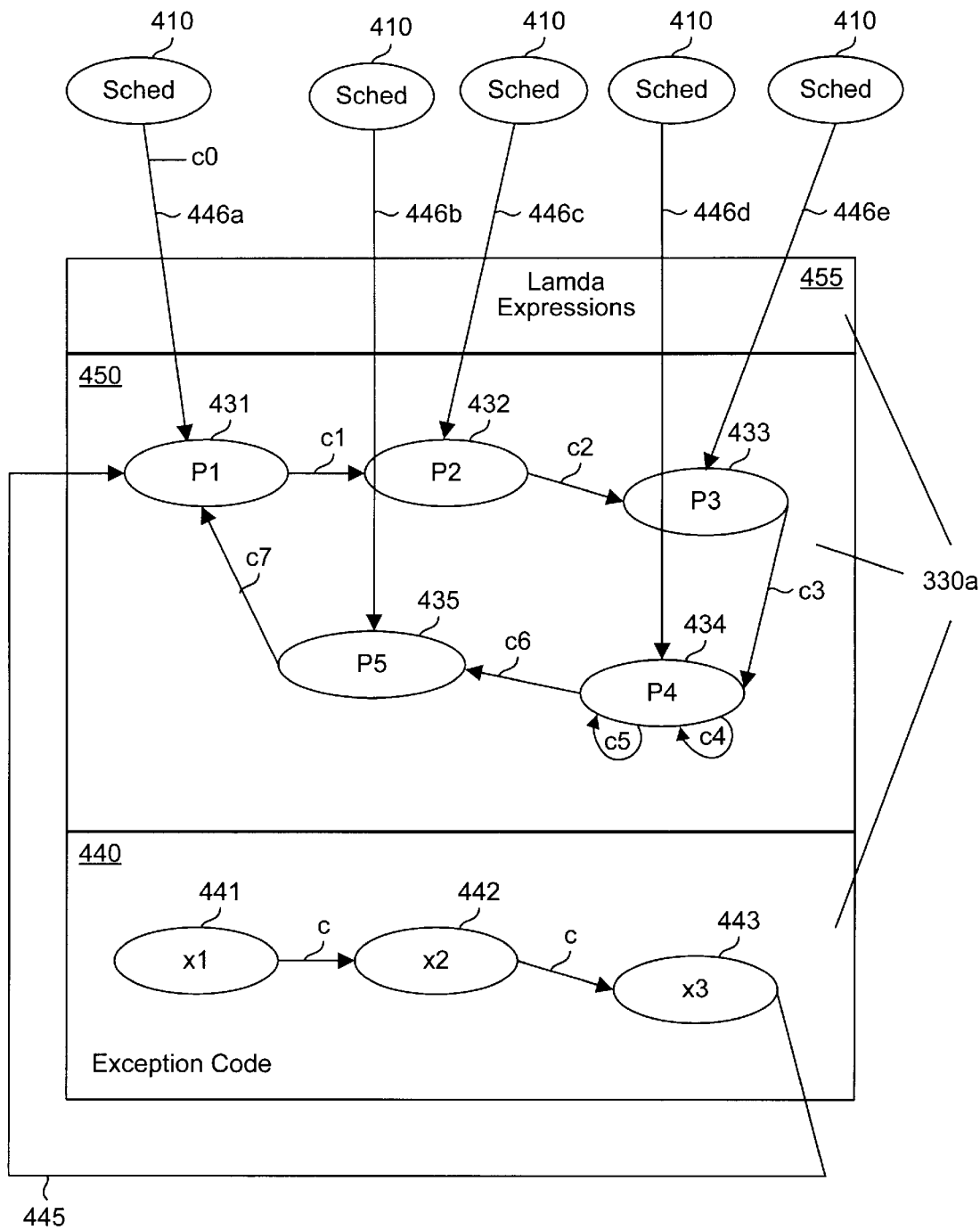
FIG. 8B is a logical element diagram of the user process of FIG. 8A but illustrating that execution control of the multiple sub-processes is granted from the scheduler process of the present invention.

Although the segments 431–435 are shown in a "tail to head" arrangement, it is the scheduler 410 that actually schedules and controls the execution of these process segments, as illustrated in diagram form in FIG. 8B. In other words, the scheduler 410 passes execution control (via control lines 446a–446e) to the respective segments 431–435 which individually pass control back to the scheduler when they reach a next or wait statement with the user process' code.

Referring FIG. 8B, each execution control line 446a–446e from the scheduler 410 must logically pass through a set of lambda expressions. 455 that make up the user process 330a. This symbolizes in pictorial form that a process segment of segments 431–435 will not be scheduled to execute if the user process 330a is waiting for a lambda expression to become true and that expression has not yet become true. These lambda expressions are found in "wait_until( )" statements that inform the scheduler that the user process 330a is not be executed again until some expression becomes true or until some event occurs as represented by a set of signal states. The "wait_until( )" statements are placed in the segment's code in lieu of a wait or next statement. Therefore, if the lambda condition is not true, then at the next clock edge of clock 310a, the next segment of 431–435 will not be entered and must wait until the lambda expression becomes true before executing.

For example, if the last statement of segment 432 was a "wait until (p)" statement:

```
user_process330a:
{
    {
        /* code segment 431 */
    }
    next();
    {
        /* code segment 432 */
    }
    wait_until(p);
    {
        /* code segment 433 */
    }
    next();
    {
        /* code segment 434 */
    }
    next(3);
    {
        /* code segment 435 */
    }
    next();
}
``` then at c2, if p is not true then segment 433 will not be entered and process 330a will not be scheduled for execution at c2. If p is true by the next clock edge at c3, then segment 433 will be entered at the start of c3 instead of at the start of c2 as shown, etc. Therefore, as shown with respect to FIG. 8A and FIG. 8B, the presence of the lambda expressions 455 act as a control blocking feature for the user process.

The process segments 441, 442, and 443 of region 440 within FIG. 8A and FIG. 8B represent exception handling code within user process 330a. The exception code 440 is entered when an event within the user process' watching list is found to be true on the start of the appropriate clock edge. Exception expressions are added to a process' watch list by a "watching" statement:

watching (p);

There are two types of exceptions: top-level exceptions and inner-level, or hierarchical, exceptions. Top-level exceptions are watched at all times, whereas inner-level exceptions may be registered and deregistered. In general, top-level exceptions are used in the following manner. The top-level exceptions are registered in the constructor, and the code for handling exceptions is placed at the beginning of the "try" block:

```
try {
    x;
    while (true) {
        y;
    }
}
catch (sc_user) {
}
``` where x is the exception code 440 and y is the main body 450. When p becomes true, the execution of y is terminated and the exception code x is entered. The exception code, x, can itself contain msegments, as where x is the exception code 440 and y is the main body 450. When p becomes true, the execution of y is terminated and the exception code x is entered. The exception code, x, can itself contain msegments, as where x is the exception code 440 and y is the main body 450. When p becomes true, the execution of y is terminated and the exception code x is entered. The exception code, x, can itself contain msegments, as shown in FIG. 8B. In this case, it takes three clock cycles to execute all of exception cod 440. It is appreciated that an exception can occur while within the exception code 440 which can cause another exception code to be entered. As shown by control flow 445, once the exception code has completed, the non-exception processes 450 of the user process 330a are re-entered at the first segment, i.e., segment 431. Reset events are typically modeled by exception handling in this fashion.

Figure 8C:
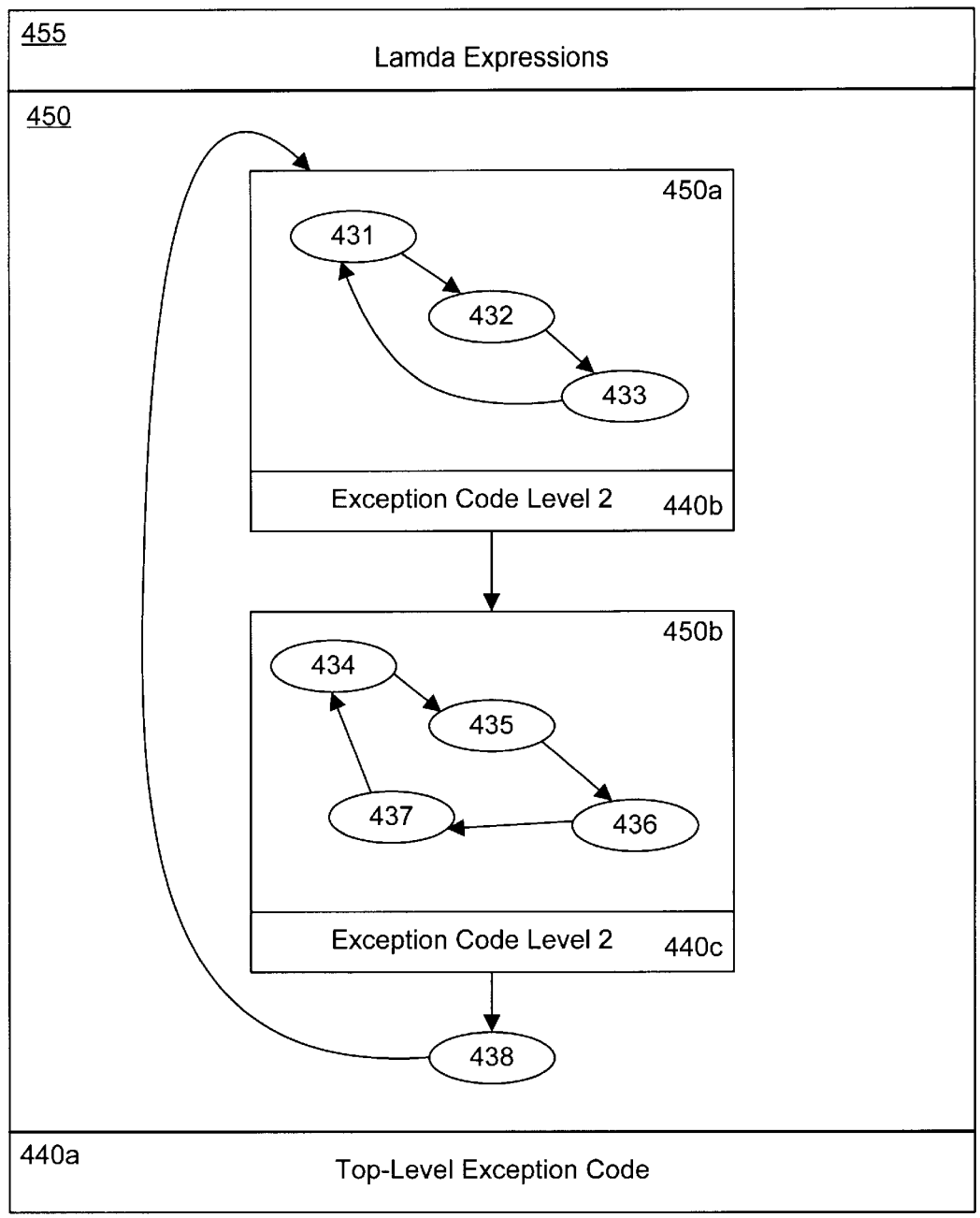
FIG. 8C is a logical element diagram of a user process having hierarchical exception routines within the present invention.

FIG. 8C illustrates a logical element diagram 430' of a user process that contains hierarchical exception code portions 440a, 440b, and 440c. Hierarchical exceptions are used in the following manner:

W_BEGIN
  watching(q);
W_DO
  y;
W_ESCAPE
  x;
W_END where q is the event to watch during the execution of y, and x is the exception code that is entered upon the occurrence of q. Upon the completion of x, should it be executed, control is transferred to the code that follows W_END. It is appreciated that if q does not occur during an execution of y, the exception code x is not entered.

In FIG. 8C, within the main process body 450 of this user process, the segments 431–433 and 434–437 are arranged in a hierarchical fashion with the first within block 450a and the second within block 450b. Exception code 440b is associated with the block 450a, and exception code 440c with block 450b. Portion 450 also contains the segment 438. In this arrangement, exception code 440b is responsible for handling the watched events associated with code block 450a, and exception code 440c is responsible for handling the watched events associated with code block 450b. For example, if q is an event that is to be watched when code block 450a is entered, and q occurs during the execution of 450a (say segment 432), then 440b will be entered.

Outer-level exceptions take precedence over inner-level ones. This means that if two or more exceptions occur at the same time, the code associated with the outermost exception will be executed. For instance, if the reset signal is being watched as the top-level exception, and during the execution of segment 432 both the reset signal is raised and the event q occurs, then exception code 440a will be entered, because the reset signal is associated with the outermost-level exception and therefore takes precedence over inner-level exceptions.

General Reactivity. Wait Until and Lambdas. Within the present invention, a waiting user process suspends itself until some event occurs. For example, a user process 330a can, after its initialization, wait for a signal start to be asserted before starting its operation. In VHDL one can write:

wait_until start ='1'

Using this wait for a synchronous digital circuit requires that signal start be sampled at a clock edge. This is accomplished as follows:

```
loop
    wait until clk'event and clk = '1';
    exit when start = '1';
end loop
```

The analogous expression in within the present invention is:

do {next( );} while (start.read( ) !='1');

While the above syntax achieves the desired effect, it can be made more efficient because every call to next( ) causes a context switch to the next process in the clock's process-list or to the clock, and in some computer systems context switches are expensive. The context switches to and from the current process serve only to evaluate the expression E on which the process is waiting. The present invention recognizes that if the evaluation of E occurs outside of the current user process 330a (e.g., the evaluation occurs within the scheduler 410), then many unnecessary context switches can be avoided. Instead of unconditionally switching back to the user process 330a to evaluate E, the present invention's decision to switch is based on the value of E. Only when E evaluates to true in the current cycle does the present invention perform a context switch to the user process 330a.

To permit the schedular to evaluate the expression E, a user process needs to make E known externally. Therefore, within the present invention E is delay-evaluated because if the expression E was written, as shown above, it would be evaluated immediately and a truth value would be obtained, not an expression. The present invention creates an object that encapsulates the expression to be evaluated and which provides a function, eval( ), that allows any other process with a handle to the object to force its evaluation. Within the present invention, these delay-evaluated expressions are called lambda expressions or simply lambdas. Two different implementations of lambdas are discussed below, static and dynamic.

Static lambda creation is discussed first. One way to implement lambdas is to use a closure that consists of a function and a set of arguments serving as the function's environment of evaluation. For example, the present invention uses the following function to represent the condition that is set out to wait on.

```
bool signal_is_1(sc_signal<std_ulogic>& s)
{
    return (s.read() == '1');
}
```

A lambda is created by supplying a pointer to the function and the signal, start, which will be passed to the function when the evaluation is forced:

sc_lambda start_is_1(signal_is_1, start)

where sc_lambda is the library class that represents a lambda object. Then, in the body of the user process (e.g., 330a), the present invention requires the expression:

wait_until (start_is_1);

to pass to the clock process (scheduler 410) the static lambda object, start_is_1. At each clock edge, the scheduler 410 evaluates the lambda by invoking the function eval( ), which effects the application of the function part (signal_is 1) to the argument part (start). The suspended user process (e.g., 330a) is woken-up only if the result is true which advantageously avoids a context switch if the result is false.

Dynamic lambda creation is now discussed. Static lambda creation requires the designer to write the function representing the lambda and explicitly instantiate the lambda object. The creation of lambdas can be facilitated within the present invention by using the expression:

wait_until(start=='1');

This takes advantage of the ability in C++ to overload operators. Here the operator == is overloaded such that, when a signal appears in the expression, a lambda object is created. In this case, no user-defined function such as signal is_1 is involved; the lambda object is represented as an expression tree. Evaluation of the lambda object consists of interpreting the tree at run-time. Thus, dynamic lambda objects of the present invention are less efficient than static ones; the loss is not significant, however, because most expression trees are very small. It is appreciated that the difference between (start.read( )=='1') and (start=='1') is important. In the former the expression is evaluated immediately, but in the latter, a lambda is created and passed as argument to wait_until( ).

General Reactivity, Watching. The syntax for watching is discussed further. An important property of reactive systems is the capability to react to preemptions or interrupts. One of the most commonly used preemption in hardware design is the use of reset, which, regardless of the present state of the system, always brings the system to the reset state. It is the system's responsibility to watch for preemptions at all times. It is one area where the ability of existing HDLs such as VHDL and Verilog to model interrupts is lacking. For instance, assuming that all signals (including those carrying preemption) external to a user process are synchronized at clock boundaries, VHDL requires the designer to test for such signals at every clock boundary, such as:

wait until clk'event and clk='1';
exit reset_loop when reset='1';

where reset_loop is the outermost loop that encloses the reset sequence and the main loop. If pre-synthesis and post-synthesis simulations are to yield the same results, then these statements are required. This is practical if reset were the only preemption that is being watched. However, as more preemptions are added that the user process watches, the code can become unwieldy. Furthermore, if preemptions are explicitly checked on every clock boundary, one would not be able to take advantage of the delayed evaluation of lambda expressions, since the preemptive conditions may occur at any time, in particular before the lambda is evaluated to be true.

The present invention solves this problem using the C++ exception handling mechanism, namely try, catch, and throw in conjunction with the watching function. In the present invention, each user process has a watch-list which is maintained in memory 102 of system 112 (FIG. 1), to which lambda expressions are added during object instantiation. All the lambdas on the watch-list of a user process are evaluated on every clock edge associated with the user process. For instance, the statement in the user-defined constructor:

watching (reset=='1');

creates a lambda corresponding to the condition that signal reset is raised, and registers this condition with the user process' watch-list.

The following exemplary code shows an example with several preemptive conditions.

```
Counter::Counter()
{
    watching( reset == '1' );
    watching( pwr_dn == '1');
    watching( test == '1');
}
Counter::Counter()
{
    watching( reset == '1');
    watching( pwr_dn == '1');
    watching( test == '1');
}
void Counter::entry()
{
    try {
        if (reset.read() == '1')
            /* DO RESET */
        else {
            if (pwr_dn.read() == '1')
                /* DO POWER DOWN */
            if (test.read() == '1')
                /* DO TEST */
        }
        /* MAIN BODY OF PROCESS */
    }
    catch (sc_user) {
    }
}
```

The member function entry( ) uses the try/catch construct to implement the handling of preemptions within the present invention. A C++ exception of type sc_user is thrown from the next( ) or wait_until( ) functions. These functions receive a notice from the scheduler 410 when one or more of the lambdas in the watch-list evaluate to true, and instead of returning normally, they throw an exception which is caught by the catch block. The code within the catch block handles the preemptions.

It is appreciated that for the toplevel events only one type of exception, namely sc_user, is thrown. This effectively allows maximum flexibility for the handlers when two or more preemptions of the same level occur during the same clock cycle. For example, the user may decide to prioritize the preemptions or to take special actions for various combinations of preemptions. In the above exemplary code, the handlers are written such that reset has the highest priority and is handled exclusively of the other two conditions. Also, pwr_dn has a higher priority than test but they are not exclusive; in other words, if both signals are raised in the same cycle, the actions for pwr_dn are executed first, and then those for test. Moreover, as described further below, hierarchical exceptions can be maintained. An inner-level exception watching is introduced by the W_BEGIN construct, as shown in the following example:

```
W_BEGIN
    watching(timeout=='1');
W_DO
    /*PERFORM TASK*/
W_ESCAPE
    /*TIMEOUT OCCURRED*/
W_END
```

In this construct, an exception (timeout=='1') is first registered in the process's watch-list. Then, the code following W_DO is executed. During the execution of this code, the exception is watched on every clock cycle. If the signal timeout becomes '1' during that time, the execution is aborted, the exception (timeout=='1') is removed from the watch-list (so that it is no longer watched), and control is diverted to the code that follows W_ESCAPE, and then falls through to W_END.

Figure 9A:
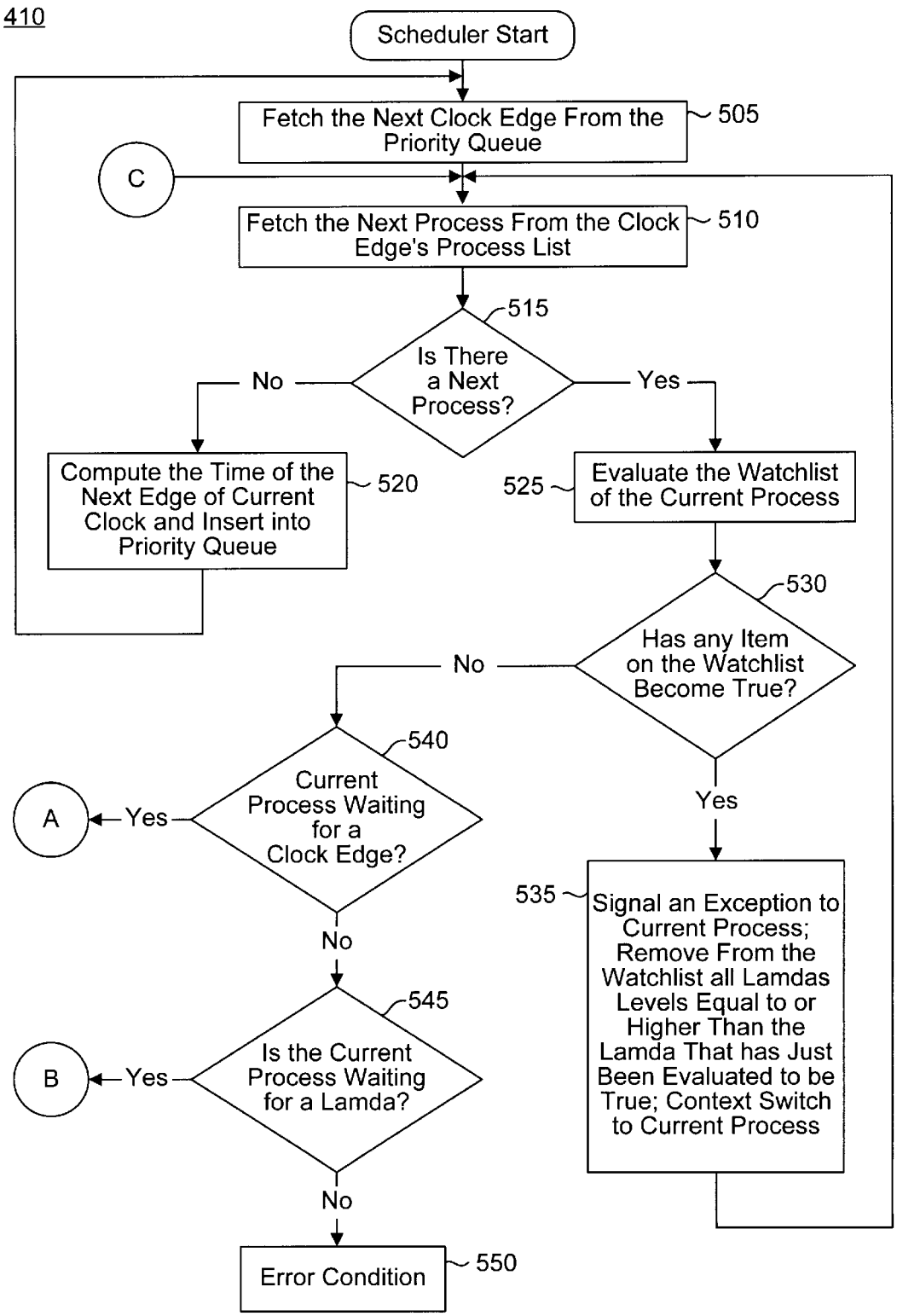
FIG. 9A, FIG. 9B and FIG. 9C illustrate a flow diagram of the scheduler process of the present invention for scheduling the execution of user processes.
Figure 9B:
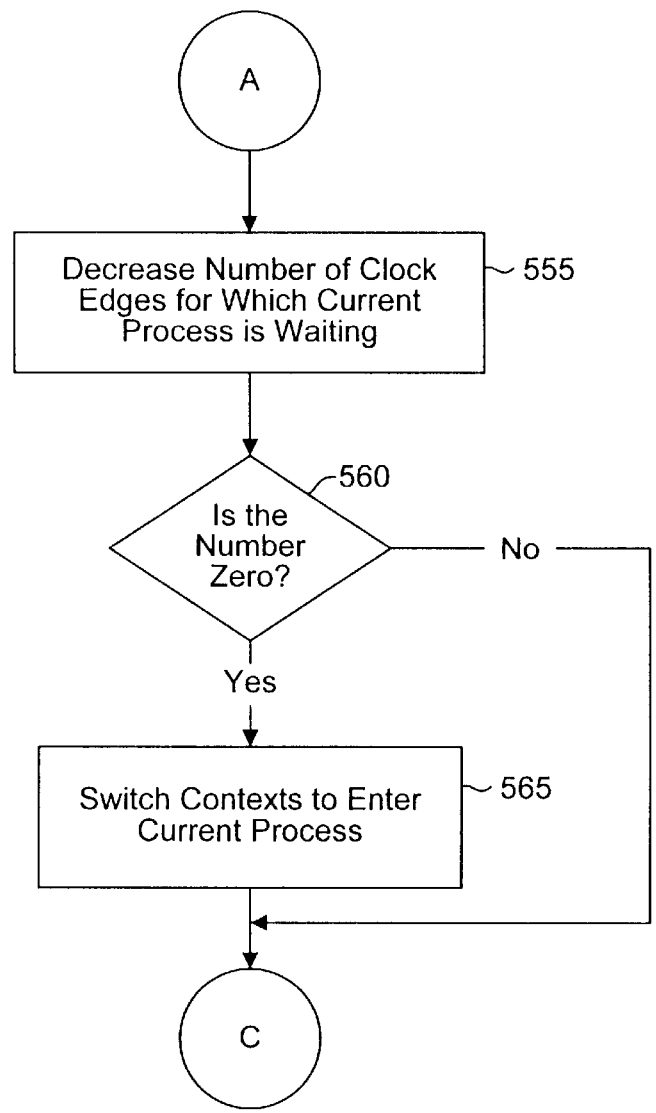
Figure 9C:
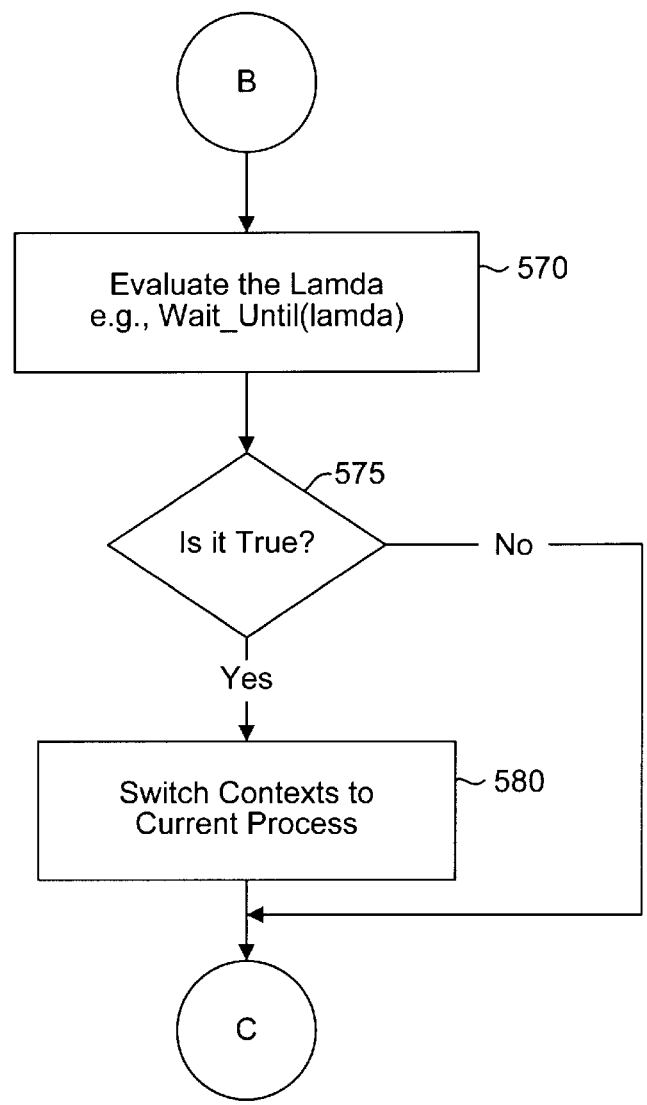

Flow Diagrams. FIG. 9A, FIG. 9B and FIG. 9C illustrate steps performed by the scheduler 410 of the present invention for implementing reactivity (and concurrency) within the present invention. Specifically, the scheduler process 410 implements the use of next/wait( ), wait_until( ), and watching( ). Scheduler process 410 is implemented as instructions stored in computer readable memory units of system 112 (FIG. 1) and executed over processor 101 of system 112.

In FIG. 9A, at block 505, the scheduler 410 fetches the next clock edge from the priority queue 405 in memory 102. This is the highest priority clock edge in the time referenced priority queue 405. At step 505, the present invention also fetches the process list of user processes that are associated with the selected clock edge. This list is also maintained in memory 102. At step 510, the present invention attempts to select a next (or current) user process from the selected process list to schedule for execution. At step 515, the scheduler 515 determines if there is a next user process or if the previous user process was the last user process of the selected process list. If there is no next user process at step 515, then step 520 is entered where the scheduler 410 computes the time of the next clock edge of the currently selected clock. This is determined by taking the time stamp of the selected clock edge and adding to that the period of the selected clock. The result is then inserted into its appropriate slot within the priority queue 405 along with an indication of the selected clock and the edge (rising or falling). Scheduler 410 then returns to step 505 to fetch the next clock edge from the priority queue 405.

At step 515 of FIG. 9A, if a next user process exists, then step 525 is entered where the next user process becomes the current user process and is scheduled for execution at this time. At step 525, the scheduler 410 evaluates the watchlist of the current user process. The watchlist, as described above, is a list of expressions (lambdas) within memory that represent exceptions. Exceptions, when evaluated to be true, interrupt the normal flow of program code within a user process and cause predetermined portions of process code to be immediately executed (e.g., a reset, a power down, etc.). Within a user process, exceptions are added to the watchlist via watching statements. At step 530, if any of the exceptions in the watchlist become true, then step 535 is entered, else step 540 is entered. At step 535, the scheduler 410 removes all lambdas of levels equal to or higher than the lambda that has just been evaluated to be true; signals an exception to the current user process; and then performs a context switch to enter and execute the current user process. When the current user process returns control back to the scheduler 410, step 510 is reentered to fetch the next user process of the selected clock's process list.

At step 540 of FIG. 9A, the scheduler 410 did not see an exception of the watchlist become true, so the present invention checks if the current user process is waiting for a clock edge. In other words, at step 540 scheduler 410 determines whether or not the current user process last exited via a next( ) or wait( ) function. If so, then step 555 of FIG. 9B is entered. If not, step 545 of FIG. 9A is entered. At step 545, the scheduler 410 of the present invention checks if the current user process is waiting for a lambda. If the current user process is not waiting for a lambda at step 545, then an error condition exists and step 550 is entered. If the current user process is waiting for a lambda at step 545, then step 570 of FIG. 9C is entered.

At step 555 of FIG. 9B, the current user process is waiting for a clock edge. The next( ) and wait( ) commands contain arguments indicating the number of clock edges that are required to pass before the next segment of the current user process is to be entered. This number, default of one, is stored in a memory location. At step 555, the scheduler 410 accesses this number and decreases by one the number of clock edges for which the current user process is waiting. The decremented number is then stored back into memory 102. At step 560, the present invention checks if the decremented number is zero. If the number is nonzero, then the current user process is not yet ready to be executed and needs to wait for at least one more clock cycle. So, step 510 of FIG. 9A is entered so that the next user process of the process list can be fetched. At step 560, if the number is zero, the current user process is now ready to be entered and executed at the current clock cycle. Therefore, at step 565, the scheduler 410 context switches and enters and executes the current user process at the appropriate process segment. When the current user process subsequently returns control to the scheduler 410, step 510 is then re-entered to fetch the next user process of the selected clock's process list.

At step 570 of FIG. 9C, the current user process is waiting for a lambda before it is to execute. At step 570, the present invention evaluates the lambdas that have been defined for the user process. At step 575, the present invention determines if the lambda for which the current process is waiting is true. If it is not true, then the current user process is not yet ready to be executed so step 510 of FIG. 9A is entered so that the next user process of the process list can be fetched. Therefore, the present invention advantageously avoids performing the context switch into the current user process if the lambda condition is false. At step 575, if the lambda is true, the current process is now ready to be entered at the current clock edge. Therefore, at step 580, the scheduler 410 context switches and enters the current user process at the appropriate segment. When the current user process subsequently returns control to the scheduler 410, step 510 is then re-entered to fetch the next user process of the selected clock's process list to schedule.

The steps of FIG. 9A, FIG. 9B and FIG. 9C repeat for each clock edge fetched from the priority queue 405 until some user defined event signals an end to hardware simulation or a specified user defined time period expires. Therefore, concurrency is simulated by sequentially scheduling for execution user processes of a clock's process list. Further, reactivity is modeled by the scheduler 410 via next, wait, wait_until and watching functions.

Figure 10A:
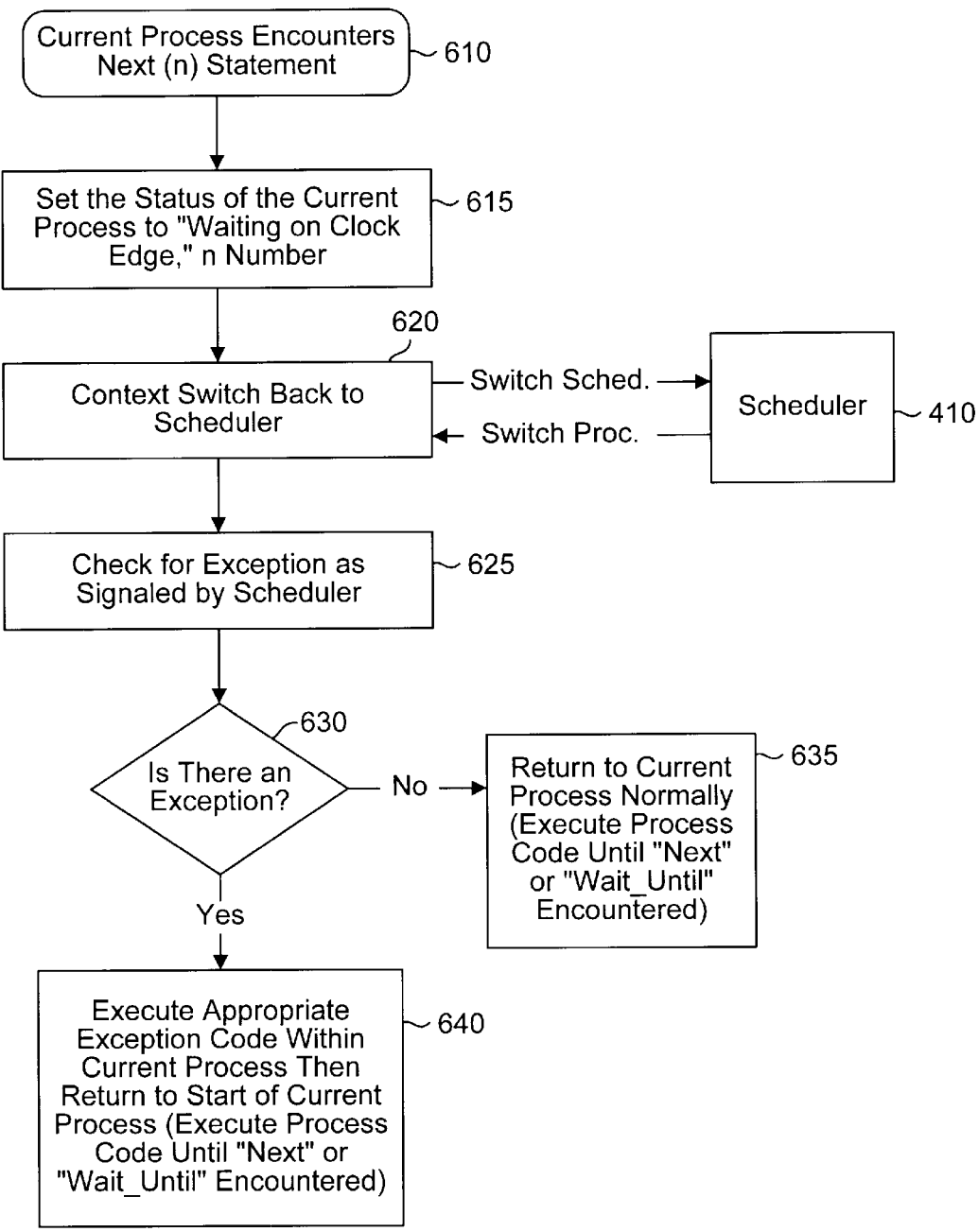
FIG. 10A and FIG. 10B illustrate generic steps that are inherited by each user process of the present invention from the base class for transferring execution control to and from the scheduler.

FIG. 10A illustrates the general flow 600 of control within a user process. It is appreciated that while flow 600 is described with respect to a particular or "current" user process (e.g., process 330i), flow 600 is in fact executed by all user processes 330a–330y within the framework of the present invention. It is appreciated that each user process (330a–330y) is implemented as program instructions stored in computer readable memory units of system 112 and executed over processor 101. The description of flow 600 commences at an event 610 where the current user process encounters a next(n) or a wait(n) statement. When this occurs, the current user process is informed that its execution for the current clock cycle is over and a pointer indicating the next segment (of 431–435 of FIG. 8A) to enter is recorded. The current user process at step 615 sets its status to "waiting for clock edge" and also associates a number, n, of clock edges found in the next(n) statement. At step 620, the current user process then switches contexts and transfers control back to the scheduler 410.

When the scheduler 410 of FIG. 10A returns control back to the current user process (as described in FIGS. 9A–9C), at step 625 the current user process then checks if an exception has been thrown as signaled by the scheduler 410. If no exception has been thrown, then at step 635, the present invention accesses a segment pointer to determine the next segment of segments 431 435 (FIG. 8A) of the nonexception code 450 to enter. At step 640, the nonexception code 450 is executed until a next( ) or a wait( ) or a wait_until( ) is reached. If a next( ) or a wait( ) is reached, step 615 is then entered. However, if a wait until( ) is reached, step 660 of FIG. 10B is entered.

At 630 of FIG. 10A, if an exception has been thrown by the scheduler 410, then at step 640 the current user process calls the exception code (e.g., code 440 of FIG. 8B) within the current user process. Simultaneously, a segment pointer within the current user process is reset such that the first segment (e.g., segment 431 of FIG. 8B) of the non-exception code 450 is scheduled next to execute upon the next clock cycle after the exception code 440 is completed. At step 640, the exception code is executed until a next( ) or a wait( ) or a wait_until( ) is reached. If a next( ) or a wait( ) is reached, step 615 is then entered. If a wait_until( ) is reached, step 660 of FIG. 10B is entered.

Figure 10B:
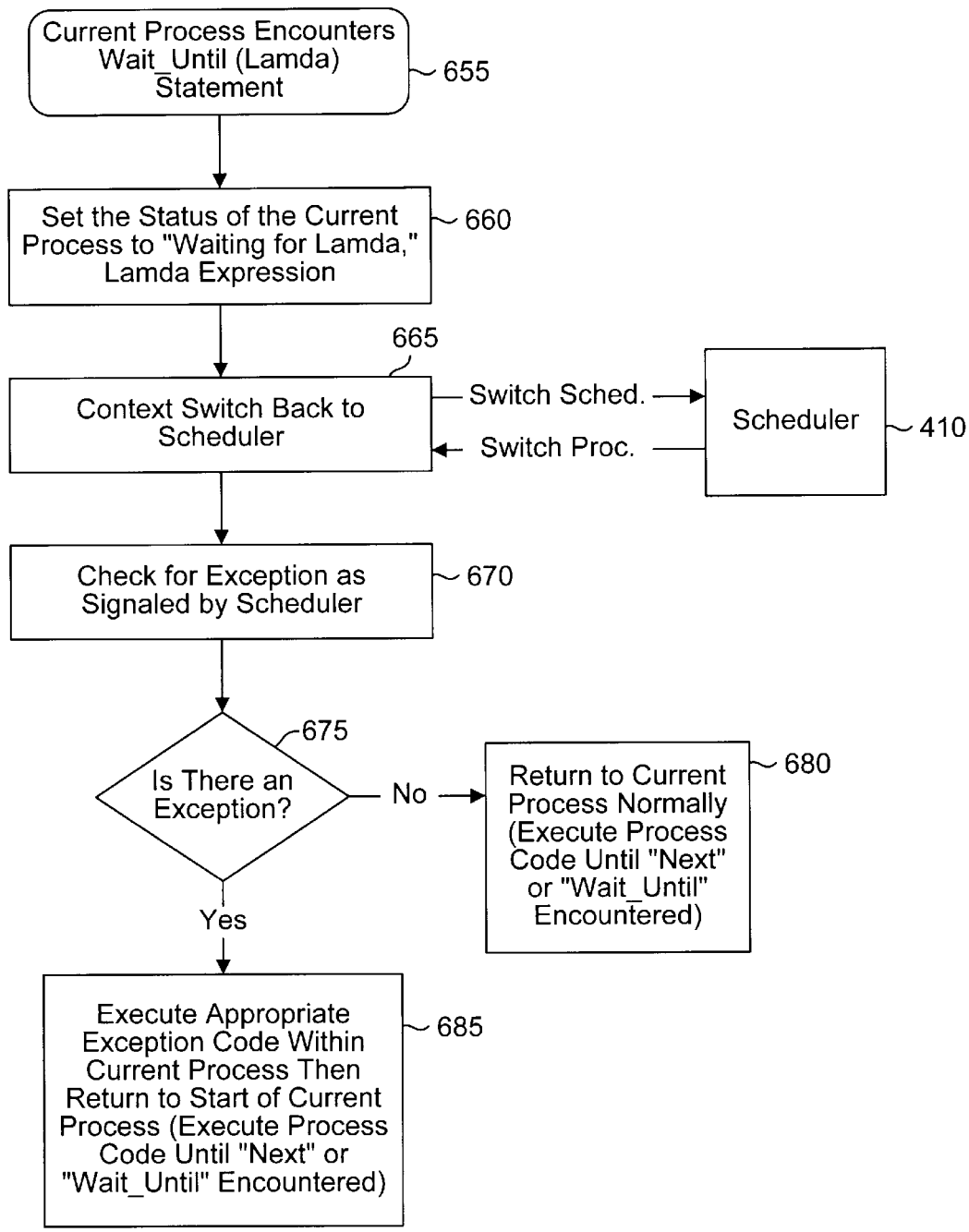

FIG. 10B illustrates the general flow 650 of control within a user process. It is appreciated that while flow 650 is described with respect to a particular or "current" user process (e.g., process 330i), flow 650 is in fact executed by all user processes 330a–330y within the framework of the present invention. The flow 650 commences at an event 655 where the current user process encounters a wait_until (lambda) statement. When this occurs, the current user process is informed that its execution for the current clock cycle is over and should not begin again until the lambda condition is true and its next clock edge is seen and a pointer indicating the next segment (of 431–435 of FIG. 8A) to enter is recorded. The current user process at step 660 sets its status to "waiting for lambda" and also associates lambda with its status. At step 665, the current user process then switches contexts and transfers control back to the scheduler 410.

When the scheduler 410 of FIG. 10B returns control back to the current user process, at step 665 the current process then checks if an exception has been signaled by the scheduler 410. If no exception has been signaled, then at step 680, the present invention accesses the segment pointer to determine the next segment of segments 431–435 (FIG. 8A) of the nonexception code 450 to enter. At step 680, the nonexception code 450 is executed until a next( ) or a wait( ) or a wait_until( ) is reached. If a next( ) or a wait( ) is reached, step 615 of FIG. 10A is then entered. If a wait_until( ) is reached, step 660 of FIG. 10B is entered.

At 675 of FIG. 10A, if an exception has been signaled, then at step 685 the current user process transfers control to the exception code for the appropriate level (e.g., code 440 of FIG. 8B and 440*b* of FIG. 8C) within the current user process. Control continues with the code that follows the exception code, or returns to the beginning of the process in the case of a top-level exception. At step 685, the exception code is executed until a next( ) or a wait( ) or a wait_until( ) is reached. If a next( ) or a wait( ) is reached, step 615 of FIG. 10A is then entered. If a wait_until( ) is reached, step 660 of FIG. 10B is entered.

Reactivity and Base Class 380 Implementation. The following exemplary program code illustrates one implementation of the base class 380 of the present invention which is inherited by all user processes. The code that follows is segmented into sc_process.h which outlines certain class definitions and function declarations; the implementations of all but the simplest functions are found in sc_process.cc. Together these code segments form the base class 380 (called sc_process). The code, sc_process.h, defines the interface for the base class 380 (sc_process), so that the user process can inherit the basic functionalities of the base class 380. The interface consists of: (a) a constructor which is invoked when a process object is created; (b) query functions for obtaining information about the user process; and (c) the concurrency and reactivity functions: next( ), wait_until( ), and watching( ). The constructor requires a reference to a clock edge (type sc_clock_edge) against which the user process will be synchronized, and optionally a name (char*) and a stack size. The query functions can be used to obtain information such as the name of the user process, the clock to which the user process is synchronized, etc. The next( ), wait_until( ), and watching( ), inherited by the user process, give it the capability of concurrency and reactivity.

---

THE SC_PROCESS.H OF THE PRESENT INVENTION

```
#ifndef SC_PROCESS_H
#define SC_PROCESS_H
#include "sc_lambda.h"
class sc_clock;
class sc_clock_edge;
class sc_lambda;
class sc_slambda;
class sc_process : public sc_process_base
{
    friend class sc_clock;
    friend class sc_clock_edge;
public:
    // Defualt stack size is 64k bytes
    static const size_t DEFAULT_STACK_SIZE = 0x10000;
    // Returns the clock driving this process. Used to
    // information about the clock object
    sc_clock& clock( ) const { return clk; }
    sc_clock_edge& clock_edge( ) const { return clk_edge; }
protected:
    // Constructor - the user supplied the reference to the
    // clock that drives it in its initializer for the base
    // class. This defines clock, name and stack size for a
    // process when first created.
    sc_process( sc_clock_edge& ce,
                const char* nm = 0,
                size_t stack_size = DEFAULT_STACK_SIZE );
    sc_process ( sc_clock& ck,
                const char* nm = 0,
                size_t stack_size = DEFAULT_STACK_SIZE );
    // Destructor
    virtual ~sc_process( );
    // The user defines the body of the user process in the virtual
    // function <entry( )>. The body is enclosed in an implicit
    // infinite loop; thus it will be executely repeatedly even if
    // the user does not explicitly say so. The <halt( )>
    // method. Therefore, the entry( ) provides a link or
    // entry point to the user process to invoke the behavior
    // (<{q.v.}>) is used to break from this infinite loop.
    virtual void entry( ) = 0;
    // Puts a lambda on the watchlist - dynamic or static.
    // <group>
    void watching( const sc_lambda_ptr& lambda );
#ifdef SC_USE_SLAMBDA
    void watching( const sc_slambda& slambda );
#endif
    // </group>
    // Terminates the current process (break out of the
    // implicit infinite loop).
```

-continued

THE SC_PROCESS.H OF THE PRESENT INVENTION

```
        void halt( );
            // Waits for a specified number of cycles, or 1 by
            // default.
            // <group>
        void wait( int cycles = 1 );
        void next( int cycles = 1 ) { wait(cycles); }
            // </group>
            // For static lambda, an additional argument for context
            // information may be supplied (typically unused).
            // <group>
        void wait_until( const sc_lambda_ptr& lambda );
#ifdef SC_USE_SLAMBDA
        void wait_until( const sc_slambda& slambda, void* arg=0 );
#endif SC_USE_SLAMBDA
            // </group>
            // Like wait_until( ), an additional
            // argument for context information may be supplied for
            // the static lambda (typically unused).
            // <group>
        void test_and_wait( const sc_lambda_ptr& lambda );
#ifdef SC_USE_SLAMBDA
        void test_and_wait( const sc_slambda& slambda, void* arg=0 );
#endif
            // </group>
#ifndef NO_NESTED_WATCHING
private:
        int wlev;
protected:
        void reset_watching( )    { wlev = 0; }
        void open_watching( )     { wlev++; }
        void close_watching( )    { wlev--; }
        int watch_level( ) const  { return wlev; }
        void sanitycheck_watchlists( ) const;
#endif
/*-----------------------------------------------------------*/
/* Following is a particular data implementation: */
/*-----------------------------------------------------------*/
private:
        static void* aborthelp( qt_t*, void* old, void* );
        static void* yieldhelp( qt_t* sp, void* old, void* );
        static void only( void*, void* p, qt_userf_t* );
        void init( size_t stack_size );
        void free_stack( );
        qt_t* qt( ) { return sp; }
        qt_t* next_qt( );
        bool ready_to_wakeup( );
        bool eval_lambda( );
#ifdef SC_USE_SLAMBDA
        bool eval_slambda( void* arg=0 );
#endif
        bool eval_watchlist( );
        bool decrement_wait( );
private:
        qt_t* sp;                     // QuickThreads handle
        void* stack;                  // 'new'-allocated stack space
        sc_clock& clk;                // reference to the clock
        sc_clock_edge& clk_edge;      // reference to the clock edge on
which this
                                      // process is sensitive
        enum { WAIT_CLOCK, WAIT_LAMBDA, WAIT_SLAMBDA, WAIT_UNKNOWN }
wait_state;
        int wait_cycles;              // number of cycles remaining
        sc_lambda_ptr lambda;         // the lambda the process is
waiting on
#ifdef SC_USE_SLAMBDA
        const sc_slambda* slambda;    // pointer to a static lambda;
        void* slarg;
#endif
        int exception_level;          // -1 if no exception
        list<sc_lambda_ptr> watchlist; // list of lambdas to watch for
(toplevel)
#ifdef SC_USE_SLAMBDA
        list<const sc_slambda*> watchlist_s; // list of static lambdas
to watch for
#endif
#ifndef NO_NESTED_WATCHING
        vector< list<sc_lambda_ptr> > dwatchlists;
```

-continued

THE SC_PROCESS.H OF THE PRESENT INVENTION

```
#endif
    list<sc_process*>::iterator handle;
};
#endif
```

With reference to the above implementation, the present invention uses the function, entry( ), as a behavioral interface between the base class 380 and a user process. The function, virtual void entry( ), is a virtual function convention and allows the base class to interact with the user processes. This function allows the base class to access the behavior of the user process because the user process defines its behavior in a process called "entry( )" which is invoked via the scheduler 410 of the present invention. In a process list, a pointer is maintained into the "entry( )" routine for each user process. The scheduler 410 uses this pointer to get the next user process of the process list.

Much of sc_process.h declares the available methods for the base class sc_process, with the corresponding implementation given in sc_process.cc. The file sc_process.h contains the implementation of several simple methods such as clock( ) and clock_edge( ), which return the clock object and the clock-edge object, respectively, associated with the user process.

The following functions declared in sc_process.h implement concurrency reactivity. The watching functions place an event on the process' watchlist. The halt function stops a user process, whereas wait and next suspend the process to the next clock cycle. The wait_until function suspends the process until the condition becomes true.

The code below, sc_process.cc, contains the multiple functions used by the present invention in one implementation to realize portions of the flow diagrams of FIG. 9A, FIG. 9B, and FIG. 9C.

THE SC_PROCESS.CC OF THE PRESENT INVENTION

```
#include <errno.h>
#include <stdio.h>
#include <string.h>
#include <assert.h>
#include "sc_process.h"
#include "sc_clock.h"
#ifdef SC_USE_SLAMBDA
#include "sc_slambda.h"
#endif
/******************************************************
    stack_align( ) is taken from stp.h in the QT distribution.
******************************************************/
inline void*
stack_align( void* sp, int alignment )
{
    return ((void*)(((((qt_word_t)sp) + alignmnent - 1) &
~(alignment -1)));
{
/******************************************************
    aborthelp( ) is the helper function for terminating a
    coroutine. The second argument is a pointer to the sc_process
    that is about to die.
******************************************************/
void*
sc_process::aborthelp( qt_t*, void* old, void* )
{
    ((sc_process*)old)—>free_stack( );
    return 0;
```

-continued

THE SC_PROCESS.CC OF THE PRESENT INVENTION

```
}
/******************************************************
    yieldhelp( ) is the helper function for context switching out
    of a coroutine. The first argument 'sp' is the the stack
    pointer of the old coroutine, and the second argument is a
    pointer to the sc_process that switched out.
******************************************************/
void*
sc_process::yieldhelp( q_t* sp, void* old, void* )
{
    return ((sc_process*)old)—>sp = sp;
}
/******************************************************
    only( ) is the function that is the entry point of a
    sc_process. Only the second argument, which is a pointer to
    the associated sc_process, is used.
******************************************************/
void
sc_process::only( void*, void* p, qt_userf_t* )
{
    sc_process* proc = (sc_process*) p;
    try
    {
        // Run process in an infinite loop, unless exceptional
        // condition happens, e.g. uncaught user watchlist events,
        // or process termination. This gives the user the
        // illusion that
        // a "process" is being written not a "procedure"
        while (true)
        {
            proc—>entry( );
        }
    }
    catch (sc_user)
    {
        // The user watches for something but never caught it.
    }
    catch (sc_halt)
    {
        // The process has died. Requiem aeternam.
        cout<< "Terminating process" << proc—>name( ) << endl;
    }
    // If control reaches this point, then error condition
    qt_t* next_qt = proc—>next_qt( );
    proc—>clock_edge( ) .remove_from_runnable( proc );
    QT_ABORT( aborthelp, proc, 0, next_qt );
}
/******************************************************
    free_stack( ) is called when a process aborts. It's only
    called when the user-defined process terminates voluntarily
    (i.e., due to calling halt( ) but not due to simulation
    running out of time).
******************************************************/
void
sc_process::free_stack( )
{
    delete[ ] (char*)stack;
    stack = 0;
}
/******************************************************
    Constructor for the base class sc_process. The user-defined
    process is publicly derived from this class, and must pass a
    reference to the clock to this constructor in the initializer,
    and, optionally, a user-defined name and/or the size of the
```

THE SC_PROCESS.CC OF THE PRESENT INVENTION -continued

```
    stack to be allocated for the coroutine. If 'nm' is omitted,
    a unique name is generated. If 'stack_size' is omitted, then
    default is used.
************************************************/
sc_process::sc_process( sc_clock_edge& ce, const char* nm, size_t
stack_size )
    : sc_process_base(nm), clk(ce.clock( )) , clk_edge(ce)
#ifndef NO_NESTED_WATCHING
    , dwatchlists(10)
#endif
{
    init( stack_size );
}
sc_process::sc_process( sc_clock& ck, const char* nm, size_t
stack_size )
    : sc_process_base(nm), clk(ck), clk_edge(ck.pos( ))
#ifndef NO_NESTED_WATCHING
    , dwatchlists(10)
#endif
{
    init( stack_size );
}
void
sc_process::init( size_t stack_size )
{
    clk_edge.add_to_runnable(this);
    wait_state = WAIT_UNKNOWN;
    wait_cycles = 0;
    exception_level = -1;
    /* create a coroutine for the sc_process */
    assert( (stack = new char[stack_size]) != 0 );
    void* sto = stack_align( stack, QT_STKALIGN );
    sp = QT_SP( sto, stack_size - QT_STKALIGN );
    sp = QT_ARGS( sp, this, this, 0, only );
#ifndef NO_NESTED_WATCHING
    reset_watching( );
#endif
}
/************************************************
    sc_process::~sc_process( ) is the destructor for sc_process.
    Need to destroy all the lambdas that were added to the
    watchlist, as well as the stack space.
************************************************/
sc_process::~sc_process ( )
{
    delete[ ] (char*)stack;
}
/************************************************
    watching( )
************************************************/
void
sc_process::watching( const sc_lambda_ptr& lambda )
{
#ifndef NO_NESTED_WATCHING
    if (watch_level( ) == 0)
        watchlist.push_back( lambda );
    else
        dwatchlists[watch_level( )].push_back( lambda );
#else
    watchlist.push_back( lambda );
#endif
}
#ifdef SC_USE_SLAMBDA
void
sc_process::watching( const sc_slambda& slambda )
{
    watchlist_s.push_back( &slambda );
}
#endif
/************************************************
    ready_to_wakeup( )
************************************************/
bool
sc_process::ready_to_wakeup( )
{
    bool exception = eval_watchlist( );
    if (exception) return true;
    bool ready;
    switch (wait_state)
    {
    case WAIT_CLOCK:
        ready = decrement_wait( );
        break;
    case WAIT_LAMBDA:
        ready = eval_lambda( );
        break;
#ifdef SC_USE_SLAMBDA
    case WAIT_SLAMBDA:
        ready = eval_slambda( slarg );
        break;
#endif
    default:
        ready = true;
        break;
    }
    return ready;
}
/************************************************
    halt ( )
************************************************/
void
sc_process::halt( )
{
    // A process is not to be halted right away. It may be the
    // last process in its clock's process list, and if it is
    // killed, signal updates can be lost. Waits for
    // another cycle, and then throws the sc_halt exception to get
    // out of the loop.
    wait_cycles = 1;
    wait_state = WAIT_CLOCK;
    QT_BLOCK( yieldhelp, this, 0, next_qt( ) );
    throw sc_halt( );
}
/************************************************
    wait ( )
************************************************/
void
sc_process::wait( int cycles )
{
    wait_cycles = (cycles <= 1) ? 1 : cycles;
    wait_state = WAIT_CLOCK;
    QT_BLOCK( yieldhelp, this, 0, next_qt( ) );
    wait_state = WAIT_UNKNOWN;
#ifndef NO_NESTED_WATCHING
    if (exception_level == 0) {
        reset_watching( );
        throw sc_user( );
    }
    else if (exception_level > 0)
        throw exception_level;
#else
    if (exception_level == 0)
        throw sc_user ( );
#endif
}
/************************************************
    decrement_wait( )
************************************************/
bool
sc_process::decrement_wait( )
{
    return (--wait_cycles == 0);
}
/************************************************
    wait_until( )
************************************************/
void
sc_process::wait_until( const sc_lambda_ptr& lamb )
{
    lambda = lamb;
    wait_state = WAIT_LAMBDA;
    QT_BLOCK( yieldhelp, this, 0, next_qt( ) );
    wait_state = WAIT_UNKNOWN;
    // Some might object to the idea of using C++ exception
```

THE SC_PROCESS.CC OF THE PRESENT INVENTION
-continued

```
    // handling mechanism to implement watching( ) and waiting( )
#ifndef NO_NESTED_WATCHING
    if (exception_level == 0) {
        reset_watching( );
        throw sc_user( )
    }
    else if (exception_level > 0)
        throw exception_level;
#else
    if (exception_level == 0)
        throw sc_user( );
#endif
}
/****************************************************
    next_qt ( )
****************************************************/
qt_t*
sc_process::next_qt( )
{
    list<sc_process*>::iterator it = handle;
    it++;
    while (true)
    {
        if (it == clock_edge( ) .runnable_end( ))
            return clock_edge( ) .qt( );
        sc_process* np = *it;
        if (np—>ready_to_wakeup( ))
            return np—>qt( );
        else
            it++;
    }
}
/****************************************************
    eval_lambda( )
****************************************************/
bool
sc_process::eval_lambda( )
{
    return lambda—>eval( );
}
#ifdef SC_USE_SLAMBDA
bool
sc_process::eval_slambda( void* arg )
{
    return slambda—>eval(arg);
}
#endif
/****************************************************
    eval_watchlist( )
****************************************************/
bool
sc_process::eval_watchlist( )
{
    list<sc_lambda_ptr>::iterator wit = watchlist.begin( );
    while (wit != watchlist.end( ))
    {
        if ((*wit)—>eval( ))
        {
            exception_level = 0;
#ifndef NO_NESTED_WATCHING
            for (int i = 1; i <= watch_level( ); ++i) {
                list<sc_lambda_ptr>& 1 = dwatchlists[i];
                l.erase( l.begin( ), l.end( ) );
            }
#endif
            return true;
        }
        wit++;
    }
#ifdef SC_USE_SLAMBDA
    list<const sc_slambda*>::iterator wits = watchlist_s.begin( );
    while( wits != watchlist_s.end( ) )
    {
        const sc_slambda* slamb = *wits;
        if (slamb—>eval( ))
        {
            exception_level = 0;
```

THE SC_PROCESS.CC OF THE PRESENT INVENTION
-continued

```
#ifndef NO_NESTED_WATCHING
            for (int i = 1; i <= watch_level( ); ++i) {
                list<sc_lambda_ptr>& 1 = dwatchlists[i];
                l.erase( l.begin( ), l.end( ) );
            }
#endif
            return true;
        }
        wits++;
    }
#endif
```

With reference to the above implementation, the function watching( ) inserts a delay-evaluated expression, or lambda, into the watchlist. All lambdas in the watchlist are evaluated on each clock edge, and if any is evaluated to be true, an exception is signaled. The function next_qt( ) returns the QT (QUICKTHREADS) handle of the next user process on the clock's process list within the present invention. If the current process is the last one, then return the QT handle of the clock. The function wait_until( ) blocks the current user process until the expression enclosed in 'lambda' evaluates to true on a clock edge.

The function wait_until( condition) is semantically equivalent to do {wait( ); } while (! condition); but more efficient. It is appreciated that wait_until( ) always synchronizes on the next clock edge. That is, regardless of whether the condition being waited for is true in the current cycle, it is the value seen in the next edge that matters. The function decrement_wait( ) decreases the number of cycles that the user process is waiting for. If after decrement, the number reaches zero, then returns true; otherwise, return false. The function wait( ) blocks the current user process until the next clock edge (default), or waits for the specified number of cycles, e.g., wait(k) is equivalent to k successive calls to wait( ), only more efficient. The current user process will then be woken up by the clock process that drives it. The function next( ) is synonymous with wait( ).

The function eval_lambda( ) forces the evaluation of the lambda on which the user process is waiting. It returns the result of the evaluation. The function eval_watchlist( ) goes through the watchlist, evaluates each lambda in the watchlist, and returns true when some lambda evaluates to true. If no lambda evaluates to true (e.g., no exception occurred), then return false. It also stores the exception level into the member variable "exception_level" and removes from the watchlist any lambda that is of level equal to or higher than "exception_level." The function halt( ) terminates the current user process and removes it from the clock's runnable queue (e.g. its process list), forever. The function ready_to_wakeup( ) evaluates the watchlist of the user process, and exception is set to true if any lambda in the watchlist is evaluated to true otherwise the result is false otherwise. Then, depending on whether the user process is waiting on a clock or on a lambda, decrement_wait( ) or eval_lambda( ) is called. It is appreciated that "ready" is set to true if the condition on which the process is waiting becomes true. The function ready_to wakeup( ) returns true if an exception occurred or if the user process waits no more. The function ready_to wakeup( ) also evaluates if the number of clock cycles a user process is waiting for has passed.

The function init( ) is an initialization function which initializes a user process. Within the wait( ) function, the instruction QT_BLOCK enters the scheduler 410 and the user process is reentered at the statement wait_state= WAIT_UNKNOWN. Within the wait_until( ) function, the instruction QT_BLOCK enters the scheduler 410 and the user process is re-entered at the statement wait_state =WAIT_UNKNOWN. The function next_qt( ) looks as the process list and calls the next process that is ready to be woken up. It returns a handle to the caller of the next process to enter. The function eval_lambda( ) evaluates the lambda if a process is waiting for a lambda and is called by the function ready_to_wake_up( ). The function eval_ watchlist( ) evaluates the watchlist if a process has an exception defined and is also called by the function ready_ to_wake up( ).

VI. INSTANTIATING A PROCESS AND DESCRIBING BEHAVIOR

A user process class is declared by publicly deriving, or subtyping, from the base class 380, sc_process, thereby inheriting the fundamental capabilities of a process that are defined in the library 355 (FIG. 4). Also, when a user process is defined, its input/output interface is specified and its behavior is then described within the entry( ) function. More specifically, a user process consists of the following member variables and functions: 1) input ports, each declared as a const-qualified reference to a signal; 2) output ports, each declared as a non-const-qualified reference to a signal; 3) state variables, if any; 4) generic constants, declared as const-qualified variables; and 5) a constructor. A code example is shown directly below and is represented in logic in FIG. 13.

```
Class Counter : public sc_process {
private:
    // clock is in the base class
    const sc_signal<std_ulogic>& enable;    //input
    sc_signal<std_ulogic>& iszero;          //output
    int count;                              // internal state
public:
    Counter(
        // interface specification
        sc_clock& CLK,
        const sc_signal<std_ulogic>& EN,
        sc_signal<std_ulogic>& ZERO
    )
    // initializers
    :sc_process(CLK), enable(EN), iszero(ZERO)
    {
        count = 15;    //initialization
    }
    void entry();
};
```

The constructor for Counter takes as arguments a clock and references to the signals that comprise its input/output interface. The initializers in the constructor pass on the clock for base class initialization (sc_process(CLK)), and binds the port names to internal signal names. The behavior of the user-defined process is separately specified in the memory function entry( ), as shown further below.

In the present invention, a user process of the created class is instantiated in C++ by defining a variable of the appropriate process class and supplying arguments to the constructor. Instantiation refers to creating an actual device of a previously defined class, e.g., in the example herein an actual, individual, counter becomes created. In the present invention, to define a user process, the user defines an input/output interface and then defines a behavior. This defines a class of objects. An instantiation of a particular object within this class can then be accomplished within the present invention by defining a variable of this class, as shown below. For example, in FIG. 13, the signals enable 810 and iszero 816 are created as well as a clock 812. Illustrated by the code below, a process of type Counter1 is instantiated and then a simulation is started for 1000 cycles. Below is the body of the counter process which describes its behavior:

```
void Counter1::entry()
{
    if (enable.read() == '1') {
        if (count == 0) {
            write(iszero, '1');
            count = 15;
        }
        else {
            write(iszero, '0');
            count--;
        }
    }
    next ();
}
```

The following code instantiates a process and begins the simulation within the present invention:

```
int main()
{
    sc_signal<std_ulogic>enable;
    sc_signal<std_ulogic>iszero;
    sc_clock clk;
    Counter counter1(clk.pos(), enable, iszero);
    sc_clock::press_start_button (1000);
}
```

The simulation runs for 1000 time units. In this example, the pos( ) method is used to obtain the positive edge associated with the clock. This code fragment serves as an illustration and does not do anything useful since there is no stimulus. It is important to note that the declaration and definition of a process class defines a behavior, whereas defining a variable of a particular class creates an instance. Therefore, several instances of the same process class can be created without duplicating code or explicitly passing objects as arguments. Object-oriented languages such as C++ offer a less cumbersome way to create instances than procedural languages.

VII. THE CLOCK PROCESSES 250 OF THE PRESENT INVENTION

The sc_clock class 250 of the library 355 (FIG. 4) of the present invention provides a class of clocks. Clocks are objects within the present invention that generate pulses and synchronize user processes and other events. User processes of the present invention can instantiate clock objects of this class 250 for synchronization to implement hardware concurrency. As discussed above, many individual user processes can be synchronized to one clock object and many clock objects can be defined.

Within the present invention, a clock is created by defining a variable of type sc_clock. Each clock consists of a positive edge and a negative edge. Usually, a sequential user process (e.g., of 330a–330i) can be synchronized on one, but not both, of these edges. Edges are represented by the class sc_clock_edge. When instantiating a clock, several optional arguments can be specified: 1) a name; 2) the period of the clock; 3) the duty cycle of the clock, as a fraction of the period; and 4) the time at which the first edge (positive) of the clock is scheduled to occur. The positive edge of the clock can be retrieved by the method pos( ), and the negative edge by the method neg( ). In addition, the signal (of type sc_signal<std_ulogic>) associated with the clock can be obtained by the method signal( ); this signal is toggled each time the positive edge or the negative edge takes place.

The following code segments, sc_clock.h and sc_clock.cc are examples of one implementation of the clock definitions section 250 of the library 355 of the present invention (FIG. 4). Generally, sc_clock.h provides a clock interface and informs a user of what the capabilities of a clock are and sc_clock.cc code implements the clock features. The code sc_clock.h provides an interface so that a user process can determine what a clock's characteristics are, e.g., its name, its period, its duty cycle, its phase, and its edges. Within the present invention, sc_clock 250 is used to instantiate clock objects. Clocks have rising and falling edges and positive or negative phases. A clock has a period, and the time instant when the first edge occurs (as well as a name). A clock is used to synchronize events among user processes, but there may be multiple nonisochronous clocks as well. Implementations of the code sc_clock.h and sc_clock.cc are shown below.

SC_CLOCK.H OF THE PRESENT INVENTION

```
#ifndef SC_CLCCK_H
#define SC_CLOCK_H
#include "sc_stl.h"
#include "sc_macros.h"
#include "sc_signal.h"
struct qt_t;
enum phase_t { PHASE_NEG = 0, PHASE_POS };
// <summary> The clock process </summary>
//
class sc_clock {
    friend class sc_process;
    friend class sc_combo;
    friend class sc_clock_edge;
public:
        // Constructor - user can specify name, period, and
starting edge
        sc_clock( const char* nm = 0, double p = 1.0,
                  double d = 0.5, double s = 0.0 );
        // Destructor
    ~sc_clock( );
        // Returns the unique id of the clock.
    int id( ) const { return cid; }
        // Returns the name of the clock as a character string.
    const char* name( ) const { return name_; }
    double period( )       { return per; }
    double duty_cycle( )   ( return dut; }
    sc_clock_edge& pos( ) const { return *pos_edge; }
    sc_clock_edge& neg( ) const { return *neg_edge; }
    const sc_signal<std_ulogic>& signal( ) const { return sig; }
    typedef int (*callback_fn) ( const sc_clock_edge& edge, void* arg );
        // Begins simulation. The duration of the simulation is specified
        // in the first parameter. At each clock edge, the callback function
        // will be called with an argument if the callback function is not 0.
    static void press_start_button( double duration, callback_fn=0, void* =0 );
private:
    static int num_clocks;
private:
    int cid;                  // id of this clock
    char* name_;              // name of this clock
    double per;               // the period of this clock
    double dut;               // the duty cycle (fraction of
period)
    sc_clock_edge* pos_edge;
    sc_clock_edge* neg_edge;
    sc_signal<std_ulogic> sig;    // signal corresponding to this
clock
};
/ *************************************************************/
struct da_elem {
    int delay;
    sc_signal_delay_base* first;
};
class sc_clock_edge {
    friend class sc_process;
    friend class sc_combo;
    friend class sc_clock;
public:
// Constructor - pubiic used as an implicit type convertor
    sc_clock_edge( sc_clock& );
// Destructor
    ~sc_clock_edge( );
```

SC_CLOCK.H OF THE PRESENT INVENTION

```
    int id( ) const { return eid; }
    bool is_implicitly_converted( ) const { return eid == -1; }
// Returns the underlying clock for this clock edge
    sc_clock& clock( ) const { return clk; }
    phase_t phase( ) const { return faze; }
    const char* name( ) const { return clk.name( ); }
// Returns the period of the clock.
    double period( ) const { return per; }
// Returns the time instant of the edge that just occured.
    double prev_edge( ) const { return next_time - per; }
// Returns the time instant of the next edge.
    double next_edge( ) const ( return next_time; }
// Sets the period of the clock. Used if period not specified
// during clock creation.
    void set_period( double p ) { per = p; }
// Set the start time of the clock. Used if start time not
// specified during clock creation.
    void set_start_time( double s ) { next_time = s; }
// Updates the signals that were submitted to the update list;
// returns true if anything is updated.
    bool update_signals( );
// Advances the clock by switching into the first ready process
// in the clock's process-list. Returns false if there are no
// more processes in the clock's process-list.
    bool advance( );
// Submits a signal update request to the clock's update-list.
    void submit_update( sc_signal_base* sig );
    void submit_update_d( sc_signal_delay_base* sd, int delay );
```

In the above implementation, the code sc_clock.h, allows a user process the ability to obtain a clock's period, its duty cycle, and get its rising or falling edge. The object sc_clock edge represents a clock edge for which processes are synchronized. The sc_clock.cc implementation is shown below. A description of the functions within sc_clock.cc follows the below listed code.

SC_CLOCK.CC OF THE PRESENT INVENTION

```
#include <stdio.h>
#include <assert.h>
#include "sc_signal.h"
#include "sc_signal_array.h"
#include "sc_process.h"
#include "sc_clock.h"
#include "sc_combo_manager.h"
#include "sc_signal_delay.h"
int sc_clock_edge::num_clock_edges = 0;
list<sc_clock_edge*> sc_clock_edge::list_of_clock_edges;
/************************************************************
          sc_clock_edge( sc_clock& )
*************************************************************/
sc_clock_edge::sc_clock_edge( sc_clock& ck )
    : clk(ck), faze(PHASE_POS)
{
    eid = -1;              // implicitly converted,
    sp = 0;
    per = clk.period( );
    next_time = -1.0:
}
sc_clock_edge::~sc_clock_edge( )
{
    if (! is_implicitly_converted( )) {
        list_of_clock_edges.erase( handle );
    }
}
/****************************************************************
          yieldhelp( )
****************************************************************/
void*
sc_clock_edge::yieldhelp( qt_t* sp, void* clk_edge, void* )
{
    return ((sc_clock_edge*)clk_edge)—>sp = sp;
}
```

-continued

SC_CLOCK.CC OF THE PRESENT INVENTION

```
/************************************************************************
    submit_update(sig)
*************************************************************************/
void
sc_clock_edge::submit_update( sc_signal_base* sig )
{
    if (sig—>is_resolved( )) {
        rupdates.insert( sig );
    }
    else {
        updates.push_back( sig );
    }
}
void
sc_clock_edge::submit_update_d( sc_signal_delay_base* sd, int
delay )
{
    list<da_elem*>::iterator dit = delayed_assignments.begin( );
    while (dit != delayed_assignments.end( )) {
        if ((*dit)—>delay > delay)
            break;
        else if ((*dit)—>delay == delay) {
            sd—>set_next((*dit)—>first);
            (*dit)—>first = sd;
            return;
        }
        dit++;
    }
    da_elem* new_da = new da_elem;
    new_da—>delay = delay;
    new_da—>first = sd;
    delayed_assignments.insert( dit, new_da );
    return;
}
/************************************************************************
    update_signals( )
*************************************************************************/
bool
sc_clock_edge::update_signals( )
{
    if (! delayed_assignments.empty( )) {
        list<da_elem*>::iterator dit =
delayed_assignments.begin( );
        if ((*dit)—>delay == 0) {
            sc_signal_delay_base* sd = (*dit)—>first;
            assert(sd);
            while (sd) {
                sc_signal_delay_base* nxt = sd—>get_next( );
                if (sd—>do_xwrite( ))
                    submit_update(sd—>destination( ));
                delete sd;
                sd = nxt;
            }
            delete *dit;
            delayed_assignments.erase( dit++ );
        }
        while (dit != delayed_assignments.end( )) {
            (*dit)—>delay--;
            dit++;
        }
    }
    bool changed = !updates.empty( ) || !rupdates.empty( );
    // Update each signal that is placed on the update list.
    list<sc_signal_base*>::iterator it = updates.begin( );
    while ( it != updates.end( )) {
        list<sc_signal_base*>::iterator curr = it++;
        (*curr)—>update( );
        updates.erase( curr );
    }
    // Update each resolved signal.
    rupdates_set_t::iterator it2 = rupdates.begin( );
    while ( it2 != rupdates.end( )) {
        rupdates_set_t::iterator curr = it2++;
        (*curr)—>update( );
        rupdates.erase( curr );
    }
    return changed;
```

SC_CLOCK.CC OF THE PRESENT INVENTION

```
/************************************************************
        advance( )
************************************************************/
bool
sc_clock_edge::advance( )
{
    next_time += per;
    if (no_more_processes( ) && !clk.sig.has_successors( )) return
false;
    clk.sig.xwrite(0, '0' + phase( ));
    clk.sig.update( );
    list<sc_process*>::iterator it = runnable.begin( );
    while (true) {
        if (it == runnable.end( )) return true;
        sc_process* np = *it;
        if (np->ready_to_wakeup( )) {
            QT_BLOCK( yieldhelp, this, 0, np->qt( ));
            break;
        }
        else {
            it++;
        }
    }
    return true;
}
void
sc_clock_edge::remove_from_runnable( sc_process* proc )
{
    runnable.erase( proc->handle );
    proc->handle = runnable.end( );
}
void
sc_clock_edge::add_to_runnable ( sc_process* proc )
{
    proc->handle = runnable.insert( runnable.end( ), proc );
}
sc_clock_edge::sc_clock_edge( sc_clock& ck,
                              phase_t ph, double p, double s )
    : clk(ck), faze(ph)
{
    num_clock_edges++;
    sp = 0;
    per = p;
    next_time = s;
    handle = list_of_clock_edges.insert(
list_of_clock_edges.end( ), this );
}
/************************************************************/
typedef sc_clock_edge* sc_clock_edge_ptr;
static int
next_edge_compare( const sc_clock_edge_ptr& e1, const
sc_clock_edge_ptr& e2 )
{
    double diff = e2->next_edge( ) - e1->next_edge( );
    if (diff < 0)        return -1;
    else if (diff > 0)   return 1;
    else                 return e2->id( ) - e1->id( );
}
/************************************************************
        sc_clock::press_start_button
************************************************************/
void
sc_clock::press_start_button( double duration, callback_fn
callback,
                              void* arg )
{
    // Note that the list of clocks does not include the_combo_clock
    sc_pq<sc_clock_edge*> pq(
sc_clock_edge::list_of_clock_edges.size( ),
                             next_edge_compare );
    list<sc_clock_edge*>::iterator it =
        sc_clock_edge::list_of_clock_edges.begin( );
    while (it != sc_clock_edge::list_of_clock_edges.end( )) {
        pq.insert( *it );
        it++;
    }
    the_combo_manager.build_dependency( );
```

-continued

SC_CLOCK.CC OF THE PRESENT INVENTION

```
        // Instead of checking for (callback != 0) within the loop, it is
        // better to lift that out of the loop (to make it faster)
        if (callback != 0) {
            while ((pq.size( ) >= 2) && pq.top( )—>next_edge( ) < duration) {
                sc_clock_edge* edge = pq.extract_top( );
                if (edge—>advance( )) {
                    // if the clock still has more processes attached
                    // to it put it back to the queue
                    pq.insert( edge );
                    (void) edge—>update_signals( );
                    the_combo_manager.update_all( );
                    (void) callback( *edge, arg );
                }
            }
            // When there is only one clock left, there is no need
            // for a priority queue.
            if (pq.size( ) == 1), {
                sc_clock_edge* edge = pq.extract_top( );
                while ( edge—>next_edge( ) < duration ) {
                    if (! edge—>advance( )) break;
                    (void) edge—>update_signals( );
                    the_combo_manager.update_all( );
                    (void) callback( *edge, arg );
                }
            }
        }
        else {
            while ((pq.size( ) >= 2) && pq.top( )—>next_edge( ) < duration) {
                sc_clock_edge* edge = pq.extract_top( );
                if (edge—>advance( )) {
                    // if the clock still has more processes attached
                    // to it put it back to the queue
                    pq.insert( edge );
                    (void) edge—>update_signals( );
                    the_combo_manager.update_all( );
                }
            }
            // When there's only one clock left, there's no need for
            // a priority queue.
            if (pq.size( ) == 1) {
                sc_clock_edge* edge = pq.extract_top( );
                while( edge—>next_edge( ) < duration ) {
                    if (! edge—>advance( )) break;
                    (void) edge—>update_signals( );
                    the_combo_manager.update_all( );
                }
            }
        }
}
/************************************************************************
    Class-specific static variables.
************************************************************************/
int sc_clock::num_clocks = 0;
/************************************************************************
    sc_clock::sc_clock( ) - constructor. The user may give the clock a
    name (nm), specify its period (p), and specify the time of its first
    edge (s). Default values are specified in "sc_block.h"
************************************************************************/
sc_clock::sc_clock( const char* nm, double p, double d, double s )
{
    cid = num_clocks++;
    // Set the name of the clock
    if (nm) {
        name_ = new char[strlen(nm)+1];
        strcpy( name_, nm );
    }
    else {
        name_ = new char[16];
        sprintf( name_, "C%02d", cid );
    }
    if (p <= 0.0) {
        cout << name_ << "period must be positive, setting to 1.0"
<< endl;
        per = 1.0;
    }
    else {
        per = p;
```

SC_CLOCK.CC OF THE PRESENT INVENTION

```
    }
    dut = d;
    pos_edge = new sc_clock_edge( *this, PHASE_POS, p, s );
    neg_edge = new sc_clock_edge( *this, PHASE_NEG, p, s + d * p
};
}
sc_clock::~sc_clock( )
{
    delete[ ] name_;
    delete pos_edge;
    delete neg_edge;
}
```

With reference to the above code, the constructor sc_clock edge( sc_clock&) is used only as an implicit type converter. In one embodiment, it is provided for compatibility, so that when the user supplies an argument of type sc_clock to the constructor of sc_process, the positive edge will be used. It is appreciated that the constructor of sc_process will check if the implicit type conversion took place, and use the positive edge that was created with the sc_clock accordingly.

The function yieldhelp( ) is the helper function for switching out of a co-routine. The first argument "sp" is the stack pointer to be saved for the old co-routine, and the second argument "clk" is the pointer to the clock process which just switched out. The function submit_update(sig) puts "sig" in the resolved signal update list (rupdates) if "sig" is a resolved signal, or the regular signal update list (updates) if "sig" is a regular (nonresolved) signal. The function update_signals( ) traverses through the list of signal update requests and performs the update. The list is then emptied. This function returns true if and only if the list was originally nonempty.

The function advance( ) finds the first process in a clock process list that is ready to wake up, e.g., when its waiting time is up, its lambda evaluates to true, or some lambda on its watchlist evaluates to true. If the clock has no more processes, e.g., when all its processes have died (halt( ) method invoked), then advance( ) returns false. Otherwise this function returns true. The function sc_clock::press_start_button( double duration, callback_fn callback, void *arg ) is a class-static function invoked by the user to start the simulation within the environment of the present invention. The function "callback" is supplied by the user to monitor events (e.g., clock edges) during the simulation. At any time a clock goes high, after the signals are updated, the function "callback" is called with a reference to that clock and the user-supplied argument "arg". If "callback" is zero, then no function callback will occur. Within sc_clock::press_start_button( ), the priority queue of the present invention is identified as sc_clock::list_of_clock_edges.

The function update signals( ) examines the list of signals to be updated at the end of a clock cycle. Two different signal groups are shown. Updates includes simple signals while r updates includes lists of results for resolved signals. The function, press_start_button, is called by the user to start the simulation and is called after a netlist has been created. The user tells the present invention how long to execute the simulation. The function, advance, goes through the list of processes that are associated with a clock edge and runs the processes when they are ready to wake up. If one is ready to wake up, a context switch is performed. The priority queue 405 discussed above is found as list_of_lock_edges within the function press_start_button.

VIII. MULTI-VALUED LOGIC WITHIN THE PRESENT INVENTION

The present invention allows the representation of multi-valued logic so that a number of different physical states can be represented logically. Within the present invention, the type for representing multiple-valued logic is named std_ulogic 365 (FIG. 4). The textual representation for this type 365 are the characters 'U' (not initialized), 'X' (forced unknown), '0' (logical zero/low), '1' (logical one/high), 'Z' (high impedance), 'W' (weak unknown), 'L' (weak low), 'H' (weak high), and 'D' (don't care). The logical operators & (AND), I (OR), ^ (XOR), and ~ (NOT) are defined for operating on std_ulogic. The assignment operators &=, |=, and ^=, and the relational operators == and != are also defined within the present invention by overloading with C++. The following function implements a 1-bit multiplexor with inputs a and b and select s:

```
std_ulogic mux( std_ulogic a, std_ulogic b, std_ulogic s )
{
    return ((s == '0') ? a : b);
}
```

In order to implement multi-valued logic, the present invention creates a class called std_ulogic 365. One embodiment of this class, std_ulogic.h, is shown below. The std_ulogic class of the present invention operates in conjunction with certain look-up tables shown in FIGS. 11A to 11B and FIGS. 12A to 12D which are described further below.

STD_ULOGIC.H OF THE PRESENT INVENTION

```
#ifndef STD_ULOGIC_H
#define STD_ULOGIC_H
#include "sc_macros.h"
class std_ulogic {
    friend class std_logic_resolve;
public:
    enum std_u.logic_enum {
        UUUUU = 0,    // uninitialized
        XXXXX,        // forcing unknown
        OOOOO,        // forcing zero
        11111,        // forcing one
        ZZZZZ,        // high impedance
```

STD_ULOGIC.H OF THE PRESENT INVENTION

-continued

```
        WWWWW,       // weak unknown
        LLLLL,       // weak low
        HHHHH,       // weak high
        DDDDD,       // don't care
        N_std_ulogic_enum
    };
private:
    std_ulogic_enum val;
    static const std_ulogic_enum char_table[256];
    static const char to_char_table[N_std_ulogic_enum];
    static const std_ulogic_enum
and_table[N_std_ulogic_enum][N_std_ulogic_enum];
    static const std_ulogic_enum
or_table[N_std_ulogic_enum][N_std_ulogic_enum];
    static const std_ulogic_enum
xor_table[N_std_ulogic_enum][N_std_ulogic_enum];
    static const std_ulogic_enum not_table[N_std_ulogic_enum];
    std_ulogic( std_ulogic_enum r ) { val = r; }
    int to_index( ) const { return (int) val; }
    std_ulogic& operator=( std_ulogic_enum r ) { val = r; return
*this; }
public:
        // Default onstructor - assign the unknown value.
        std_ulogic( ) { val = UUUUU; }
        // Copy constructor - copy the val member.
        std_ulogic(const std_ulogic& r) { val = r.val; }
        // Constructor from char - use loopup table for
correspondence.
        std_ulogic(char r) { val = char_table[r]; }
        // Destructor
        ~std_ulogic( ) { }
        // Bitwise operators on std_logic
        // <group>
        std_ulogic operator&( const std_ulogic& r ) const
        {
            return std_ulogic( and_table[val][r.val] );
        }
        std_ulogic operator|( const std_ulogic& r ) const
        {
            return std_ulogic( or_table[val][r.val] );
        }
        std_ulogic operator^ ( const std_ulogic& r ) const
            return std_ulogic( xor_table[val][r.val] );
        }
        std_ulogic operator~( ) const
        {
            return std_ulogic( not_table[val] );
        }
        // </group>
        // Assignment operators from std_ulogic and from char
        // <group>
        std_ulogic& operator=( const std_ulogic& r )
        {
            val = r.val; return *this;
        }
        std_ulogic& operator=( char r )
        {
            val = char_table[r]; return *this;
        }
        // </group>
        // op= operators
        // <group>
        std_ulogic& operator&=( const std_ulogic& r )
        {
            *this = *this & r; return *this;
        }
        std_ulogic& operator|=( const std_ulogic& r )
        {
            *this = *this | r; return *this;
        }
        std_ulogic& operator^=( const std_ulogic& r )
        {
            *this = *this ^ r; return *this;
        }
        // </group>
        // Negates the value of this std_ulogic
        std_ulogic& negate( )
```

STD_ULOGIC.H OF THE PRESENT INVENTION

-continued

```
        {
            val = not_table[val]; return *this;
        }
        // Comparison operators with std_ulogic and with char
        // <group>
        bool operator==( const std_ulogic& r ) const
        {
            return (val == r.val);
        }
        bool operator==( char r ) const
        {
            return (val == char_table[r]);
        }
        bool operator!=( const std_ulogic& r ) const
        {
            return (val != r.val);
        }
        bool operator!=( char r ) const
        {
            return (val != char_table[r]);
        }
        // </group>
        // Type cast into char
        // <group>
        char to_char( ) const { return to_char_table[val]; }
        operator char( ) const { return to_char_table[val]; }
        // </group>
};
/*-----------------------------------------------------------*/
inline bool
operator==( char a, const std_ulogic& b )
{
    return (b.operator==(a));
}
inline bool
operator!=( char a, const std_ulogic& b )
{
    return (b.operator!=(a));
}
inline ostream&
operator<<( ostream& str, const std_ulogic& z )
{
    return str << z.to_char( );
}
#endif
```

Figures 11A, 11B:
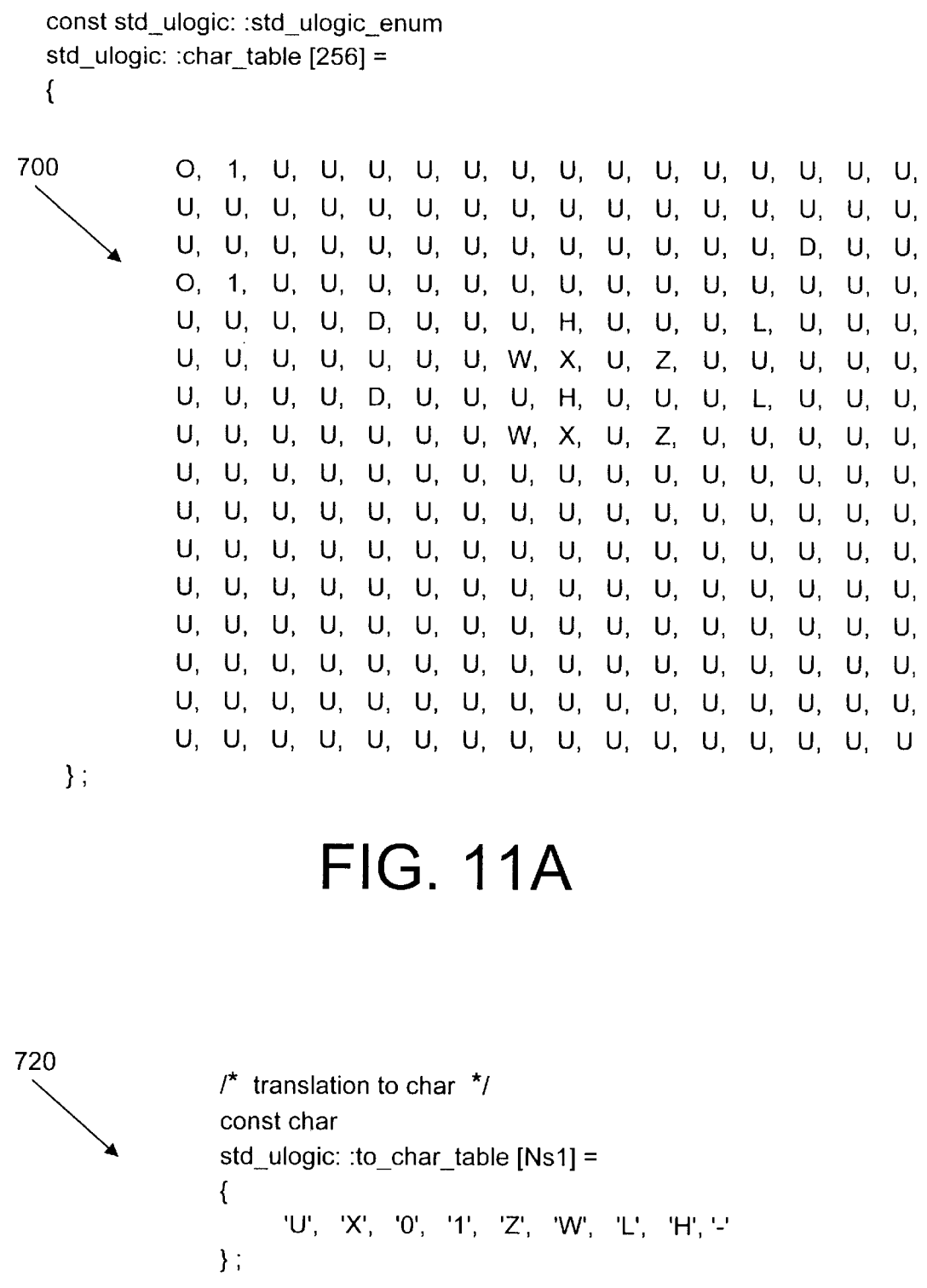

The look-up table 700 of FIG. 11A is called char_table and is used by the std_ulogic 250 of the present invention to translate between a value represented as a character (represented in ASCII or textual form) to a value representation of the multi-value logic (std_ulogic) of the present invention. Lookup table 700 is stored in computer readable memory units of system 112. Once converted into the std_ulogic type of the present invention, the value can be used in other expressions, as shown below.

The look-up table 720 of FIG. 11B, called to_char_table, is used to translate from a value represented in std_ulogic to a character value (e.g., ASCII). This translation is useful when a user process wants to display a value to an output device of system 112 (e.g., the screen 104 or a printer, etc.). Lookup table 720 is stored in computer readable memory units of system 112.

FIGS. 12A to 12D illustrate look-up tables used by the present invention for overloading certain logical operators within the present invention to realize the functions AND, OR, XOR and NOT within the std_ulogic framework. Specifically, FIG. 12A represents a two dimensional look-up table 730, called and_table, that inputs two std_ulogic defined arguments and returns the AND function of these arguments. The C++ operator & is overloaded within the present invention to perform this defined AND function.

Lookup table 730 is stored in computer readable memory units of system 112.

FIG. 12B represents a two dimensional look-up table 740, called or_table, that inputs two std_ulogic defined arguments and returns the OR function of these arguments. The C++ operator | is overloaded within the present invention to perform this defined OR function. Lookup table 740 is stored in computer readable memory units of system 112.

FIG. 12C represents a two dimensional look-up table 750, called xor_table, that inputs two std_ulogic defined arguments and returns the exclusive or (XOR) function of these arguments. The C++ operator ^ is overloaded within the present invention to perform this defined XOR function.

FIG. 12D represents a one dimensional look-up table 760, called not_table, that inputs one std_ulogic defined argument and returns the NOT function of this augment. The C++ operator ~ is overloaded within the present invention to perform this defined NOT function. Lookup tables 750 and 760 are stored in computer readable memory units of system 112.

With reference to the std_ulogic code presented above, the default constructor std_ulogic( ) is used by the present invention when a variable is defined for the first time and no further assignments are made. The constructor creates a value of type std_ulogic. For instance:

std_ulogic a;

The copy constructor, std ulogic(const std_ulogic& r), is used by the present invention when a variable is defined for the first time, but is assigned a value. The constructor creates a value of type std_ulogic. For instance:

std ulogic a=b;

where b is a known or defined value. The constructor, std_ulogic(char), is used when a variable is defined for the first time and is assigned to a character value. The constructor creates a value of type std_ulogic. It translates the ASCII code into the appropriate internal multi-value representation. For instance:

std ulogic a='1';

The operator, std ulogic operator&(const std ulogic& r) performs the logical AND function of two input std_ulogic arguments and uses operator overloading in C++ and the look-up table of FIG. 12A. For example, a & b. The operator, std_ulogic operator&(const std_ulogic& r) performs the logical OR function of two input std_ulogic arguments and uses operator overloading in C++ and the look-up table of FIG. 12B. For example, a|b. The operator, std_ulogic operator^(const std_ulogic& r) performs the logical XOR function of two input std_ulogic arguments and uses operator overloading in C++ and the look-up table of FIG. 12C. For example, a^b. The operator, std_ulogic operator~( ) performs the logical NOT function of one input std_ulogic argument and uses operator overloading in C++ and the look-up table of FIG. 12D. For example, a=~b.

The assignment operator, std_ulogic& operator=( const std_ulogic& r) is used by the present invention to assign a value to an existing variable. The assignment operator, std_ulogic& operator=(char r) is used to assign a character value to an existing variable. The compiler 230 (FIG. 2) selects the proper expression of the above based on the type of arguments supplied. The following are "op equals" operators: std_ulogic& operator&=; std_ulogic& operator|=; and std_ulogic& operator^=. These define a&=b (which is a=a&b), and a|=b (which is a=a|b), and a^=b (which is a=a^b).

The operator defined as std_ulogic& negate( ) provides for negating a std_ulogic variable, e.g., a.negate( ). The following are relational operators that are used by the present invention to compare two arguments. First is bool operator==(const std_ulogic& r) const which returns true if a equal b, for example (a==b). Second is bool operator== (char r) const which returns true if a equal b, for example (a==b) but for character based values. Third is bool operator!=(const std_ulogic& r) const which returns true if a does not equal b, for example (a!=b). Fourth is bool operator!=(char r) const which returns true if a does not equal b, for example (a!=b), but for character values.

IX. CONCLUSION AND SYNTHESIZABILITY

The C++ simulation framework or interface of the present invention has emphasized synthesizability of hardware components as well as efficient simulation and seamless integration of hardware and software. During the past decade, synthesis has proven effective in increasing design productivity, and direct synthesis from the present invention can significantly reduce the amount of effort the designer has to expand to take the design from an idea to silicon.

Table II below compares some VHDL constructs that are synthesizable by high-level synthesis systems, such as the Synopsys Behavioral Compiler, available from Synopsys of Mountain View, Calif.

TABLE II

| Action | Behavioral VHDL | The Present Invention |
|---|---|---|
| Signal Assignment | dout <= '1'; | write (dout, '1'); |
| Wait on Clock | wait until clk'event and clk = 1; | next (); |
| Wait on Condition | loop<br>wait until clk'event<br>and clk = '1';<br>exit when din = '1';<br>endloop | wait_until(din == '1'); |
| Watching reset | wait until clk'event and clk = '1';<br>exit reset_loop when reset = '1'; | watching reset == '1';<br>try { . . . } catch (sc_user)<br>{ if (reset.read() == '1') . . . } |

The purpose of this comparison is to show that the present invention provides the constructs necessary for synthesis, and how models written in the present invention framework can be synthesized. The present invention is a advantageous step in bridging the gap between high-level modeling and hardware synthesis.

The preferred embodiment of the present invention, a system and method for providing an interface to a high-level programming language for performing both system and hardware modeling for an integrated circuit design, is thus described. While the present invention has been described in particular embodiments, it should be appreciated that the present invention should not be construed as limited by such embodiments, but rather construed according to the below claims.

What is claimed is:

1. An application program interface for providing a C++ programming framework for simulating a circuit design within a computer system, said computer system having a processor coupled to a bus and a memory unit coupled to said bus, said interface realized as instructions stored in said memory unit and executed by said processor, said interface comprising:

a) a C++ base class inherited by a plurality of C++ user processes that model the circuit behavior of said circuit design, wherein said C++ base class encapsulates data structures and methods but has no circuit behavior of its own and comprises:

1) a scheduler for scheduling said plurality of C++ user processes for execution, said scheduler simulating concurrency of operation of circuits of said circuit design; and
2) a reactivity model for allowing said plurality of C++ user processes to react to events represented as signals;

b) a clock interface in C++ for defining clock objects upon which said plurality of C++ user processes are synchronized; and c) a multi-valued logic interface in C++ wherein signal values of: logical high ("1"); logical low ("0"); and high impedance; are represented by multi-value logic values, said multi-valued logic interface for AND, OR, XOR and NOT functions on multi-valued logic values.

2. An interface as described in claim 1 wherein said scheduler schedules said plurality of C++ user processes by synchronizing said plurality of C++ user processes to an edge of a respective clock object by sequentially scheduling said plurality of C++ user processes for execution upon the occurrence of said edge of said respective clock object, said edge obtained from a priority queue maintained in said memory unit and wherein said scheduler is also for computing a time of a next clock edge of said edge of said respective clock object and for placing said time of said next clock edge into said priority queue in temporal order.

3. An interface as described in claim 2 wherein said reactivity model comprises:

a watching( ) function for modeling an exception within said circuit design by causing an exception handling routine of a first C++ user process to be entered upon said occurrence of said edge of said respective clock object and an associated lambda expression evaluating true;

a next( ) function for modeling circuit functionality to be performed within one clock cycle by suspending execution of a second C++ user process until a next clock cycle of said respective clock object; and a wait_until( ) function for modeling circuit functionality that is dependent on a particular event by suspending execution of a third C++ user process until said occurrence of said edge of said respective clock object and said particular event evaluates true, said particular event represented by a lambda.

4. In a computer system having a processor coupled to a bus and a memory coupled to said bus, a method of modeling a circuit in C++ comprising the steps of:

a) modeling concurrency and reactivity within a C++ base class of a C++ library;
b) linking said C++ library to a plurality of user originated C++ user processes that model the behavior of said circuit so that said C++ base class is inherited by said plurality of C++ user processes; and
c) simulating said circuit by executing said plurality of C++ user processes, said step c) comprising the steps of:
 c1) modeling a circuit exception using a watching( ) function of said reactivity wherein exception handling C++ code of a first C++ user process is entered upon a first lambda associated with said watching( ) function evaluating true;
 c2) modeling circuit functionality to be performed within one clock cycle by suspending execution of a second C++ user process until a next clock cycle, said step c2) performed using a next( ) function of said reactivity; and
 c3) modeling circuit functionality that is dependent on a particular event by suspending execution of a third C++ user process until said particular event occurs, said step c3) performed using a wait_until( ) function of said reactivity and said particular event expressed as a second lambda.

5. A method as described in claim 4 further comprising the step of d) scheduling said plurality of C++ user processes for execution according to said concurrency, wherein said step d) is performed by a C++ scheduler and comprises the steps of:

d1) representing clock signals of said circuit as clock objects in C++ within said plurality of C++ user processes, said clock objects declared as instances of a clock class of said C++ library;
d2) synchronizing said plurality of C++ user processes to an edge of a respective clock object by sequentially scheduling said plurality of C++ user processes for execution upon the occurrence of said edge of said respective clock_object, said edge obtained from a priority queue maintained in said memory; and
d3) at the completion of a clock cycle of said clock object, computing the time of a next edge of said clock object and storing said time into said priority queue.

6. A method as described in claim 5 wherein said step c2) comprises the step of context switching from said C++ scheduler into said second C++ user process that is suspended according to said next( ) function only if a predetermined number of clock cycles of said respective clock object have passed as indicated in an argument of said next( ) function, otherwise skipping execution of said third C++ user process.

7. A method as described in claim 5 wherein said step c3) comprises the step of context switching from said C++ scheduler into said third C++ user process that is suspended according to said wait_until( ) function only if said particular event occurs, otherwise skipping execution of said third C++ user process.

8. A method as described in claim 5 further comprising the steps of:

representing multi-valued logic in said C++ library wherein signal values of: logical high ("1"); logical low ("0"); high impedance; and unknown are represented by separate internal values; and
performing AND, OR, XOR and NOT functions on arguments of said multi-valued logic.

9. A method as described in claim 5 further comprising the step of instantiating a process object within a C++ user process by (1) creating a class for said process object by defining both an input/output interface and a behavior of said process class, and (2) defining a variable of said circuit object class.

10. A method as described in claim 5 further comprising the step of interfacing said plurality of C++ user processes with said C++ scheduler using a respective entry( ) function within each C++ user process which defines the circuit behavior of each C++ user process and wherein said C++ base class contains no circuit behavior of its own.

11. A method as described in claim 5 further comprising the step of updating signals altered by said plurality of C++ user processes at the completion of each clock cycle of said respective clock object.

12. A method as described in claim 5 wherein a lambda is a delay-evaluated expression and further comprising the steps of:

said first C++ user process formulating said first lambda;

said third C++ user process formulating said second lambda;

said first and said third C++ user processes passing said first and second lambdas to said C++ scheduler for delayed evaluation;

upon said first C++ user process being scheduled for execution, said C++ scheduler evaluating said first lambda; and upon said third C++ user process being scheduled for execution, said C++ scheduler evaluating said second lambda.

13. In a computer system having a processor coupled to a bus and a memory unit coupled to said bus, a method of modeling an integrated circuit, said method comprising the steps of:

a) defining the functionality of watching( ), wait_until( ), and next( ) functions in a C++ base class of a C++ library;

b) representing clock signals as clock objects in C++, said clock objects instantiated from clock types within said C++ library;

c) representing physical circuit blocks of said integrated circuit with user processes in C++ wherein a respective clock object synchronizes a plurality of user processes and wherein each user process inherits information from said C++ base class; and d) simulating said integrated circuit design in C++, said step d) comprising the steps of:

d1) with a scheduler in C++, sequentially scheduling said plurality of user processes for execution upon an edge of said respective clock object;

d2) responsive to step d1), provided a respective user process of said plurality of user processes is suspended by a next( ) function, executing a next segment of said respective user process;

d3) responsive to step d1), provided said respective user process is suspended by a wait_until( ) function, executing said next segment of said respective user process only if a lambda associated with said wait_until( ) function evaluates true by said scheduler; and d4) responsive to step d1), provided a lambda associated with a watchlist of said respective user process evaluates true by said scheduler, executing an exception handling segment of said respective user process.

14. A method of modeling an integrated circuit design as described in claim 13 further comprising the step of:

representing multi-valued logic in said C++ library wherein the signal values of: logical high ("1"); logical low ("0"); high impedance; and unknown are represented by separate values; and performing AND, OR, XOR and NOT functions on said multi-valued logic values.

15. A method of modeling an integrated circuit as described in claim 13 further comprising the step of instantiating a process object within a user process by (1) creating a class for said process object by defining an input/output interface and a circuit behavior of said process class, and (2) defining a variable of said circuit object class.

16. A method of modeling an integrated circuit as described in claim 13 further comprising the step of interfacing each user process with said scheduler using a respective entry( ) function which defines the circuit behavior of said respective user process and wherein said C++ base class contains no circuit behavior of its own.

17. A method of modeling an integrated circuit as described in claim 13 further comprising the step of updating signals altered by said plurality of user processes at the completion of a clock cycle of said respective clock object.

18. A method of modeling an integrated circuit as described in claim 13 wherein step d) further comprises the step of d5) terminating the execution of a respective user process upon the occurrence of a halt( ) function coded therein.

19. A method of modeling an integrated circuit as described in claim 13 wherein said lambdas are delay-evaluated expressions and further comprising the steps of:

a respective user process formulating a lambda;

said respective user process passing said lambda to said scheduler for delayed evaluation; and said scheduler evaluating said lambda upon said edge of said respective clock object.

20. A computer system having a processor coupled to a bus and a memory coupled to said bus, said memory having instructions stored therein that when executed by said processor cause said computer system to implement a method of modeling a circuit in C++, said method comprising the steps of:

a) modeling concurrency and reactivity within a C++ base class of a C++ library;

b) linking said C++ library to a plurality of user originated C++ user processes that model the behavior of said circuit so that said C++ base class is inherited by said plurality of C++ user processes; and c) simulating said circuit by executing said plurality of C++ user processes, said step c) comprising the steps of:

c1) modeling a circuit exception using a watching( ) function of said reactivity wherein exception handling C++ code of a first C++ user process is entered upon a first lambda associated with said watching( ) function evaluating true;

c2) modeling circuit functionality to be performed within one clock cycle by suspending execution of a second C++ user process until a next clock cycle, said step c2) performed using a next( ) function of said reactivity; and c3) modeling circuit functionality that is dependent on a particular event by suspending execution of a third C++ user process until said particular event occurs, said step c3) performed using a wait_until( ) function of said reactivity and said particular event expressed as a second lambda.

21. A computer system as described in claim 20 wherein said method further comprises the step of d) scheduling said plurality of C++ user processes for execution according to said concurrency, wherein said step d) comprises the steps of:

d1) representing clock signals of said circuit as clock objects in C++ within said plurality of C++ user processes, said clock objects instantiated from a clock class of said C++ library;

d2) synchronizing said plurality of C++ user processes to an edge of a respective clock object by sequentially scheduling said plurality of C++ user processes for execution upon the occurrence of said edge of said respective clock object, said edge obtained from a priority queue maintained in said memory; and d3) at the completion of a clock cycle of said clock object, computing the time of a next edge of said clock object and storing said time into said priority queue.

22. A computer system as described in claim 21 wherein said step c2) comprises the step of context switching from said C++ scheduler into said second C++ user process that is suspended according to said next( ) function only if a predetermined number of clock cycles have passed as indicated in an argument of said next( ) function, otherwise skipping execution of said third C++ user process.

23. A computer system as described in claim 21 wherein said step c3) comprises the step of context switching from said C++ scheduler into said third C++ user process that is suspended according to said wait_until( ) function only if said particular event occurs, otherwise skipping execution of said third C++ user process.

24. A computer system as described in claim 21 wherein said method further comprises the steps of:
representing multi-valued logic in said C++ library wherein signal values of: logical high ("1"); logical low ("0"); high impedance; and unknown are represented by separate internal values; and
performing AND, OR, XOR and NOT functions on arguments of said multi-valued logic.

25. A computer system as described in claim 21 wherein said method further comprises the step of instantiating a circuit object within a C++ user process by (1) creating a class for said project object by defining both an input/output interface and a behavior of said process class, and (2) defining a variable of said process class.

26. A computer system as described in claim 21 wherein said method further comprises the step of interfacing said plurality of C++ user processes with said C++ scheduler using a respective entry( ) function within each C++ user process which defines the circuit behavior of each C++ user process and wherein said C++ base class contains no circuit behavior of its own.

27. A computer system as described in claim 21 wherein said method further comprises the step of updating signals altered by said plurality of C++ user processes at the completion of each clock cycle of said respective clock object.

28. A computer system as described in claim 21 wherein a lambda is a delay-evaluated expression and wherein said method further comprises the steps of:
said first C++ user process formulating said first lambda;
said third C++ user process formulating said second lambda;
said first and said third C++ user processes passing said first and second lambdas to said C++ scheduler for delayed evaluation;
upon said first C++ user process being scheduled for execution, said C++ scheduler evaluating said first lambda; and
upon said third C++ user process being scheduled for execution, said C++ scheduler evaluating said second lambda.

29. A computer readable memory unit for use by a computer system and having stored thereon instructions that, when executed by said computer system, realize an application program interface for providing a C++ programming framework for simulating a circuit design, said interface comprising:
a) a C++ base class inherited by a plurality of user processes that model the circuit behavior said circuit design, said C++ base class having no circuit behavior of its own and comprising:
1) a scheduler for scheduling said plurality of C++ user having processes for execution, said scheduler simulating concurrency of operation of circuits of said circuit design; and
2) a reactivity model for allowing said plurality of C++ user processes to react to events represented as signals;
b) a clock interface for defining clock objects upon which said plurality of C++ user processes are synchronized; and
c) a multi-valued logic interface in C++ wherein signal values of: logical high ("1"); logical low ("0"); and high impedance are represented by multi-value logic values, said multi-valued logic interface for performing AND, OR, XOR, and NOT functions on said multi-valued logic values.

30. A computer readable memory unit as described in claim 29 wherein said scheduler schedules said plurality of C++ user processes by synchronizing said plurality of C++ user processes to an edge of a respective clock object by sequentially scheduling said plurality of C++ user processes for execution upon the occurrence of said edge of said respective clock object, said edge obtained from a priority queue maintained in said memory unit and wherein said scheduler is also for computing a time of a next clock edge of said edge of said respective clock object and for placing said time of said next clock edge into said priority queue in temporal order.

31. A computer readable memory unit as described in claim 30 wherein said reactivity model comprises:
a watching( ) function for modelling an exception within said circuit design by causing an exception handling routine of a first C++ user processes to be entered upon said occurrece of said edge of said respective clock object and an associated lambda expression evaluating true; and
a next( ) function for modelling circuit functionality to be performed within one clock cycle by suspending execution of a second C++ user process until a next clock cycle of said respective clock object.

32. A computer readable memory unit as described in claim 31 wherein said reactivity model further comprises a wait—until( ) function for modelling circuit functionality that is dependent on a particular event by suspending execution of a third C++ user process until said occurrence of said edge of said respective clock object and said particular event evaluates true, said particular event represented by a lambda.

* * * * *